United States Patent
O et al.

(10) Patent No.: US 6,683,362 B1
(45) Date of Patent: Jan. 27, 2004

(54) METAL-SEMICONDUCTOR DIODE CLAMPED COMPLEMENTARY FIELD EFFECT TRANSISTOR INTEGRATED CIRCUITS

(76) Inventors: Kenneth K. O, 5400 NW. 39Ave. BB260, Gainesville, FL (US) 32606; Feng-Jung Huang, 285-15 Corry Village, Gainesville, FL (US) 32603

(*) Notice: Subject to any disclaimer, the term of this patent is extended or adjusted under 35 U.S.C. 154(b) by 157 days.

(21) Appl. No.: 09/645,366

(22) Filed: Aug. 24, 2000

Related U.S. Application Data

(60) Provisional application No. 60/150,480, filed on Aug. 24, 1999.

(51) Int. Cl.$^7$ .................. H01L 29/76; H01L 27/095
(52) U.S. Cl. .................. 257/471; 257/368; 257/472; 257/480; 257/481; 438/570; 438/571; 438/572
(58) Field of Search ................. 257/471, 472, 257/480, 481, 486, 288, 372, 382, 383, 384; 438/570, 571, 572, 581, 583

(56) References Cited

U.S. PATENT DOCUMENTS

| | | |
|---|---|---|
| 4,485,550 A | 12/1984 | Koeneke et al. |
| 4,513,309 A * | 4/1985 | Cricchi .................. 357/42 |
| 4,665,414 A | 5/1987 | Koeneke et al. |

(List continued on next page.)

FOREIGN PATENT DOCUMENTS

| | | |
|---|---|---|
| EP | 601823 A1 | 6/1994 |
| JP | 61049479 | 3/1986 |

OTHER PUBLICATIONS

Michael Sugino, Lex A. Akers, Michael E. Rebeschini, "Latchup–Free Schottky–Barrier CMOS" IEE Transactions on Electron Devices, vol. ED–30, No. 2, pp. 110–118 (Feb. 1983).

C. Wang, John P. Snyder, J. R. Tucker, "Sub–40 nm PtSi Schottky source/drain metal–oxide–semiconductor field–effect transistors" Applied Physics Letters, vol. 4, No. 8, pp. 1174–1176 (Feb. 22, 1999).

S. Swirhun, E. Sangiorgi, R. M. Swanson, K. C. Saraswat, R. W. Dutton "Latchup Free CMOS Using Guarded Schottky Barrier PMO" IEDM, vol. 83, pp. 402–405 (1984).

Feng–Jung Huang and K.K. O, "Metal–oxide semiconductor field–effect transistors using Schottky barrier drains" IEE (Jun. 18, 1997).

Feng–Jung Huang and Kenneth K. O, "Schottky–Clamped NMOS Transistors Implemented in a Conventional 0.8–μm CMOS Process" IEEE Electron Device Letters, vol. 19, No. 9, pp. 326–328 (Sep. 1998).

Primary Examiner—Tom Thomas
Assistant Examiner—Donghee Kang
(74) Attorney, Agent, or Firm—Saliwanchik, Lloyd & Saliwanchik

(57) ABSTRACT

The subject invention relates to a metal-semiconductor diode clamped semiconductor device and method for producing such device. A specific embodiment of the subject invention utilizes one or more Schottky barriers at, for example, the drain and/or source of at least one transistor of a field effect transistor integrated circuit. The use of one or more Schottky barriers is useful for reducing the susceptibility of latch-up for circuits having two opposite type transistors, i.e., two opposite polarity carriers, in which the two transistors are in close enough proximity to experience latch-up. This can allow the spacing between n- and p-type transistors to be reduced, thus reducing the area of the circuit. The subject invention can also allow the elimination of a metal contact by utilizing the metal layer used to form the metal-semiconductor junction in a complementary IGFET structure, to further reduce the circuit area. The subject invention is applicable to complementary metal oxide silicon (CMOS) devices. Advantageously, the manufacturing process required to produce the subject devices can require minimal adjustments to the standard processing steps used in conventional CMOS processing.

20 Claims, 28 Drawing Sheets

U.S. PATENT DOCUMENTS

| | | | |
|---|---|---|---|
| 5,212,102 A | * | 5/1993 | Iranmanesh et al. .......... 437/31 |
| 5,500,392 A | | 3/1996 | Reynolds et al. |
| 5,504,451 A | | 4/1996 | Smayling et al. |
| 5,525,829 A | | 6/1996 | Mistry |
| 5,654,858 A | | 8/1997 | Martin et al. |
| 5,663,584 A | | 9/1997 | Welch |
| 5,760,449 A | | 6/1998 | Welch |

* cited by examiner

METAL-SEMICONDUCTOR DIODE CLAMPED COMPLEMENTARY FIELD EFFECT TRANSISTOR INTEGRATED CIRCUITS

CROSS-REFERENCE TO RELATED APPLICATION

This application claims priority from provisional application U.S. Ser. No. 60/150,480, filed Aug. 24, 1999.

The subject invention was made with government support under a research project supported by National Science Foundation Grant No. NSF 9703214 MIP. The government may have certain rights in this invention.

BACKGROUND OF THE INVENTION

The subject invention pertains to a metal-semiconductor diode clamped complementary field effect transistor and corresponding integrated circuits. The method and device of the subject invention can be utilized with respect to insulated gate field effect transistors (IGFET). The circuitry of the subject invention can utilize Schottky barrier drains and/or sources to enhance performance. In particular, the design of these circuits can allow for a reduction in circuit surface area in comparison with comparable existing circuits. In a specific application, the subject invention can be applied to essentially all integrated circuits utilizing complementary metal oxide silicon (CMOS) technology. CMOS circuits, such as microprocessors, dynamic random access memory (DRAM) chips, random access memory (RAM) chips, digital signal processors (DSP) chips, and mixed signal integrated circuits, produced in accordance with the subject invention can also have reduced susceptibility to latch-up. In addition, the subject CMOS circuit designs can reduce the number of metal interconnects needed for interconnection with other circuits.

As mentioned, circuits in accordance with the subject invention can have reduced susceptibility to latch-up, where latch-up can cause a undesirable large current flow from supply to ground. Typically, the latch-up involves parasitic $n^+$-p-substrate-n-well and $p^+$-n-well-p-substrate bipolar junction transistors. Accordingly, the susceptibility to latch-up can be reduced by decreasing the current gains of the parasitic bipolar junction transistors.

Schottky barriers and their RF applications have been studied extensively (Sharma, B. L. [1984] "Metal-Semiconductor Schottky Barrier Junctions and Their Applications, New York; Mollenkopf, S., G. M. Rebeiz [1994] "A 22 GHz MIC active receiver/radiometer" *IEEE MTT-S Int. Microwave Symp. Dig.* 3:1347–1350). An insulated gate field effect transistor using Schottky barrier contacts for source and drain was first proposed in 1968 (Lepselter, M. P., S. M. Sze [1968] "SB-IGFET: An insulated-gate field-effect transistor using Schottky Barrier contacts as source and drain" *IEEE Trans. Electron Devices* 56:1400–1402). Recently, Schottky contacts (Milanovic, V., M. Gaitan, J. C. Marshall, M. E. Zaghloul [1996] "CMOS foundry implementation of Schottky diodes for RF detection" *IEEE Trans. Electron Devices* 43:2210–2214) and MOS transistors using a Schottky barrier as a drain (Huang, F.-J., K. K. O [1997] "Metal-oxide semiconductor field-effect transistors using Schottky Barrier Drains (SBDR)" *Electron. Lett.* 33(15):1341–1342) were studied using foundry CMOS processes. The transistors suffer from high drain to substrate leakage current and low breakdown voltages (Huang, F.-J., K. K. O [1997], supra; Yu, A. Y. C., E. H. Snow [1968] "Surface effects on metal-silicon contacts" *J. Appl. Phys.* 39(7):3008–3016) as well as reduced drain currents (Huang, F.-J., K. K. O [1997], supra). In NMOS RF amplifiers with a tuned load, especially when the supply voltage is low, it is desirable for drain nodes of some transistors to swing below GND to increase the output power level. Unfortunately for integrated RF amplifiers, this forward-biases the p-substrate-to-$n^+$-drain junction(s) and may trigger latch-up. A similar requirement exists for RF switches.

BRIEF SUMMARY OF THE INVENTION

The subject invention relates to a metal-semiconductor diode clamped semiconductor device and method for producing such device. A specific embodiment of the subject invention utilizes one or more Schottky barriers at, for example, the drain and/or source of at least one transistor of a field effect transistor integrated circuit. The use of one or more Schottky barriers is useful for reducing the susceptibility of latch-up for circuits having two opposite type transistors, i.e., two opposite polarity carriers, in which the two transistors are in close enough proximity to experience latch-up. The subject invention is applicable to insulated gate field effect transistors (IGFET). For example, the subject invention can be utilized with complementary metal oxide silicon (CMOS) devices. Advantageously, the manufacturing process required to produce the subject devices can require minimal adjustments to the standard processing steps used, for example, in conventional IGFET and/or CMOS processing.

The subject invention can enable the production of IGFET and/or CMOS circuits with a reduced area. This decreases the cost of integrated circuits and allows more functions to be integrated in an integrated circuit. Advantageously, the structure of the subject invention can be implemented within existing IGFET and/or CMOS technology processes and is also consistent with the trend for future IGFET and/or CMOS technology processes.

DETAILED DISCLOSURE OF THE INVENTION

The subject invention relates to a metal-semiconductor diode clamped semiconductor device and method for producing such device. A specific embodiment of the subject invention utilizes one or more metal-semiconductor diodes at, for example, the drain and/or source of at least one transistor of a field effect transistor integrated circuit. The use of one or more metal-semiconductor diodes is useful for reducing the susceptibility of latch-up for circuits having two opposite type transistors, i.e., two opposite polarity carriers, in which the two transistors are in close enough proximity to experience latch-up. In a specific embodiment, the subject invention is applicable to complementary metal oxide silicon (CMOS) devices. Advantageously, the manufacturing process required to produce the subject devices can require minimal, if any, adjustments to the standard processing steps used in conventional CMOS processing.

The subject invention can enable the production of CMOS circuits with a reduced area. This decreases the cost of integrated circuits and allows more functions to be integrated in an integrated circuit. Advantageously, the structure of the subject invention can be implemented within existing CMOS technology processes and is also consistent with the trend for CMOS technology processes.

Examples of semiconductor substrate materials which can be utilized with the subject invention include Si, Ge, GaAs, InP, InSb, CdTe, GaP, GaTe, CdSe, SiC, ZnSe, GaSe, CdS, GaS and ZnS. In the embodiments exemplified in the subject disclosure, Si is utilized as the semiconductor substrate material. When Si is used as the substrate material, a metal silicide-silicon junction can form the Schottky diodes at the drain and/or source. Examples of metals which can be used for the metal silicide include Au, Pt, Ni, Ti, W, Co, Rh, Pd, Zr, Ta, Cr, and Mo. Likewise, appropriate metals can be used for other semiconductor substrates. A variety of metals can also be used to form Schottky diodes at the drain and/or source from a metal-silicon junction.

Figure 1:
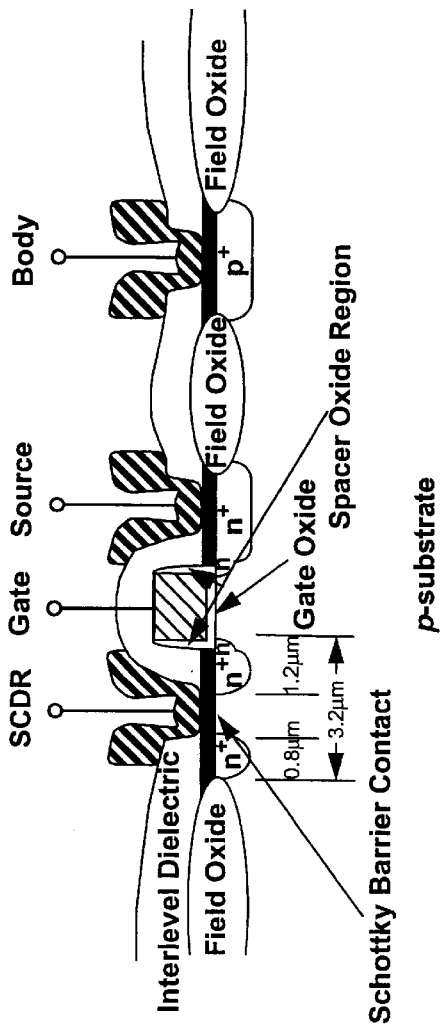
FIG. 1 shows a cross-section of a Schottky-clamped-drain (SCDR) MOSFET in accordance with the subject invention.

In a specific embodiment of the subject invention, referring to FIG. 1, a cross-section of a Schottky clamped drain (SCDR) n-channel IGFET fabricated in a foundry 0.8-$\mu$m Salicide CMOS process is shown. This IGFET has exhibited radically reduced parasitic bipolar current gains. In SCDR transistors, the parasitic $n^+$-drain/p-substrate/n-well bipolar transistor actions of CMOS technologies can be greatly reduced since the Schottky barrier which does not inject minority carriers can clamp the $n^+$-drain-to-p-substrate junction. This, in turn can reduce current gains of the parasitic drain/p-substrate/n-well transistors, and lead to significantly reduced latch-up susceptibility. Implementation of the structure can be accomplished with simple changes to an NMOS layout and minimal, if any, process modifications. Also, minimal, if any, additional mask or modifications of the salicide CMOS process are required. In addition, the SCDR NMOS transistor characteristics are comparable to those of conventional transistors.

By partially masking the source-drain implantation in the drain, a structure consisting of a $TiSi_2$—Si Schottky barrier contact and an $n^+$ implanted guard ring can be formed to obtain transistor characteristics essentially identical to those of conventional MOSFET's. Using this structure, it is possible to greatly reduce the parasitic bipolar effect in the lateral $n^+$-drain/p-substrate/n-well structure. This should enable forward-biasing of drain-to-p-substrate junctions in RF power amplifiers and switches for an increased power handling capability with significantly reduced latch-up susceptibility. Advantageously, the reverse leakage and breakdown voltage of the Schottky clamped $n^+$-p-substrate junction are higher than those of conventional junctions.

Figure 2A:
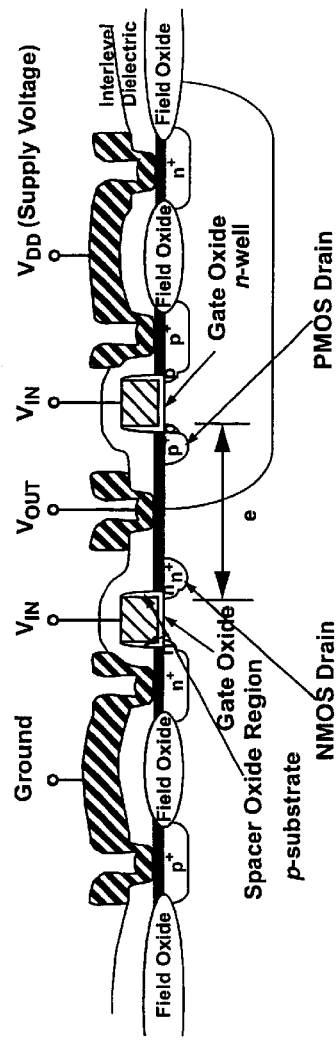
FIG. 2A shows a cross-section of an inverter implemented in accordance with the subject invention.
Figure 2B:
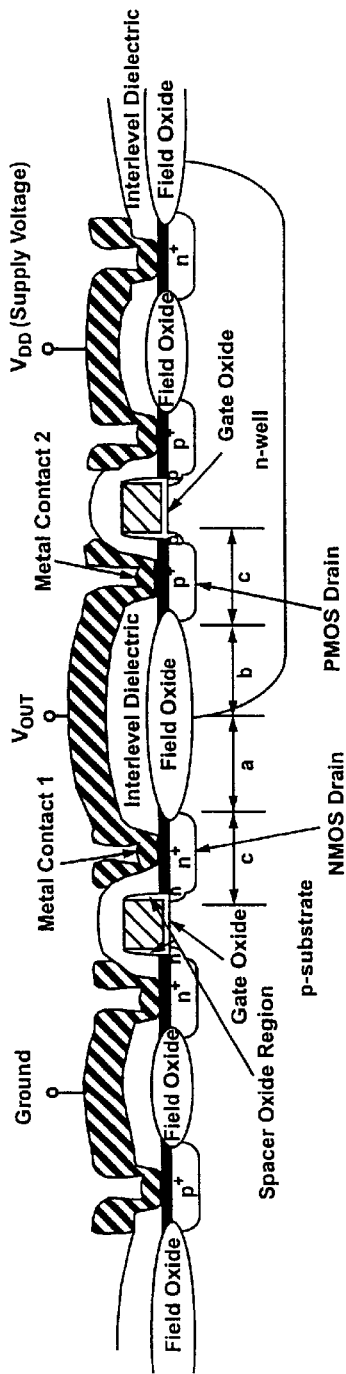
FIG. 2B shows a cross-section of an inverter implemented using a conventional CMOS process.

FIGS. 2A and 2B show cross-sections of an inverter implemented in accordance with the subject invention and an inverter implemented using a conventional complementary metal oxide silicon (CMOS) process, respectively. With respect to the conventional CMOS cross-section shown in FIG. 2B, $p^+$ and $n^+$ diffusions are separated by a space a+b. The minimum spacing for a+b is set to reduce the susceptibility to latch-up which causes an unwanted large current flow from supply to ground. This minimum spacing is one of the most significant factors which limit how small CMOS circuits can be made.

Figure 2C:
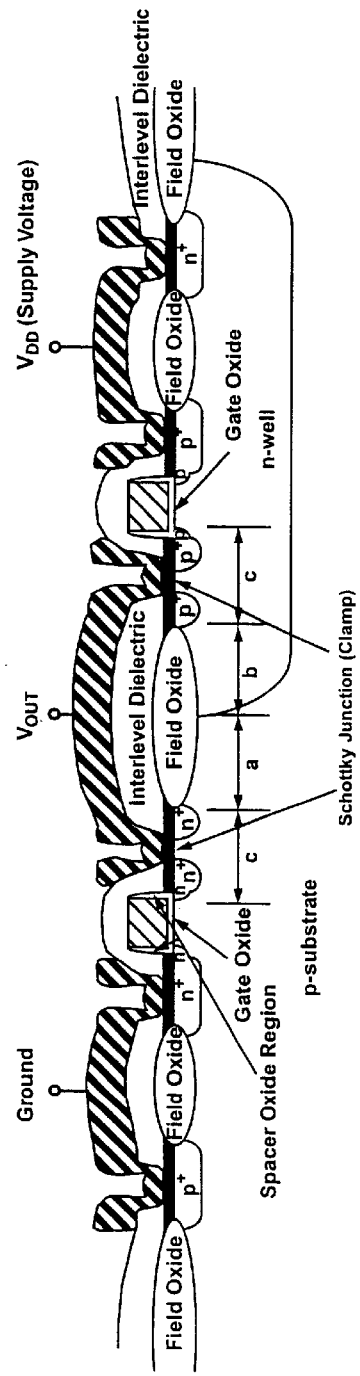
FIG. 2C shows a cross-section of a CMOS circuit having Schottky-clamped drains.

Typically, the latch-up involves parasitic $n^+$-p-substrate-n-well and $p^+$-n-well-p-substrate bipolar junction transistors and the susceptibility to latch-up can be reduced by decreasing the current gains of the bipolar junction transistors. Using Schottky-clamped NMOS and PMOS transistors (Sharma, B. L. [1984] supra), the current gains of the parasitic bipolar junction transistors can be radically reduced, enabling the spacing (a+b) between the $p^+$ and $n^+$ diffusions to be decreased, thus making CMOS circuits smaller. FIG. 2C shows a cross-section of such a Schottky-clamped CMOS circuit. Schottky junctions are metal-to-semiconductor junctions and are formed by silicide of silicon (conductor) used as part of widely used Salicide CMOS processes. The Schottky junctions can be in parallel with $p^+$ to n-well and $n^+$-to-p-substrate junctions.

Figure 2D:
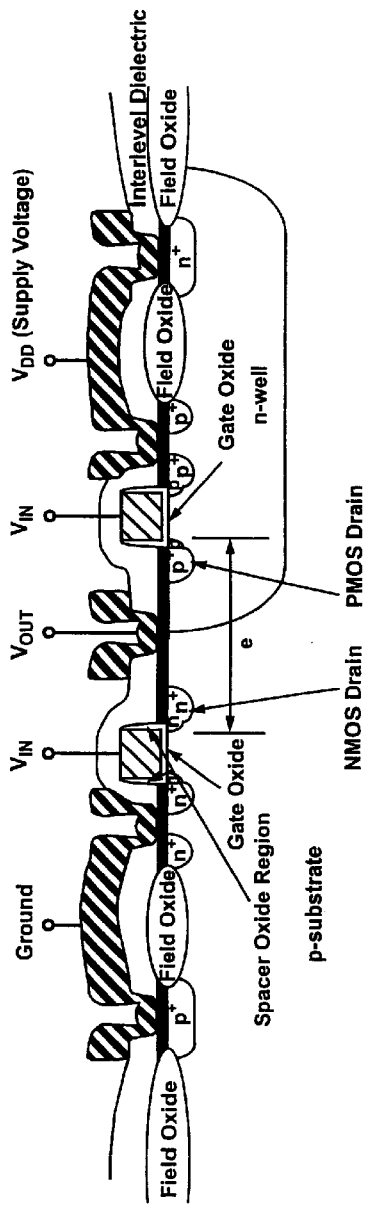
FIGS. 2D and 2E show a cross-section of a CMOS circuit having Schottky-clamped sources and drains.
Figure 2E:
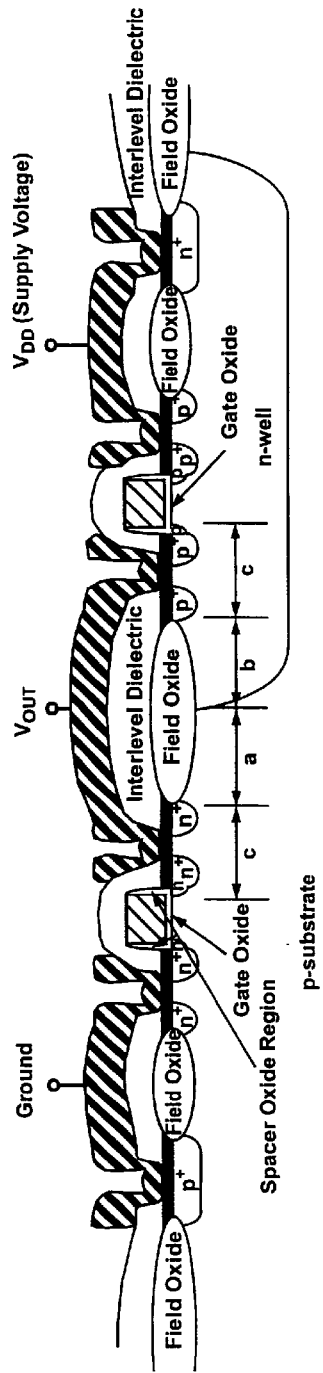

Even after incorporating Schottky junctions in parallel with the $p^+$drain to n-well and $n^+$-drain to p-substrate junctions, the latch-up susceptibility can still be relatively high. This high latch-up susceptibility can exist because $n^+$ source-p-substrate-n-well and $p^+$-source-n-well-p-substrate parasitic bipolar transistors can have current gains larger than 1. The $n^+$-drain-p-substrate-n-well and $p^+$-source-n-well-p-substrate parasitic transistors can latch. The $p^+$-drain-n-well-p-substrate and $n^+$-source-p-substrate-n-well parasitic transistors can also latch. To further reduce this susceptibility to latch-up, the sources of the NMOS and PMOS transistors can be also Schottky clamped as shown in FIG. 2D. However, Schottky clamping the sources of the NMOS and PMOS transistors is not necessarily required to prevent latch-up. For example, depending on the doping concentration of p-substrate and n-well, and the spacing between the $p^+$ source and p-substrate, and between the $n^+$ source to n-well, the current gain product of the transistor pairs could be lower than 1, such that the sources of the NMOS and PMOS transistors do not need to be clamped.

In a specific embodiment of the subject invention, CMOS circuits are produced with a reduced $n^+$ to $p^+$ spacing (a+b), a reduced number of metal interconnects, and reduced widths of $p^+$ and $n^+$ diffusions (c). As shown in FIG. 2B, in conventional structures, drains of NMOS and PMOS transistors are typically connected together through a metal interconnect and two contacts (metal contacts 1 and 2). In contrast, in a specific embodiment of the subject invention, the NMOS and PMOS drains can be connected together by extension of the silicide layer utilized to form the Schottky junctions. Examples of such structures are shown in FIGS. 2A and 2D. Accordingly, the number of contacts required to connect the drains together can be decreased to one. This reduction in the number of contacts can reduce the area of the circuit. In the conventional structure, the widths of $p^+$ and $n^+$ diffusion are c, as shown in FIG. 2B. A significant factor in the determination of these widths is the need to accommodate the metal contact. When only one contact is required, the continuous silicide area associated with $n^-$ to p-substrate, $p^+$ to -n-well, silicide-to-p-substrate, and silicide-to-n-well junctions is generally large enough to accommodate such contact. Accordingly, no extra area is needed for contacts. Furthermore, the widths of $n^+$ and $p^+$ drains can be smaller, because each diffusion does not need to accommodate a metal contact as in the conventional structure. Smaller widths of $n^+$ and $p^+$ drains can further reduce the required area for the circuit.

In a conventional structure, the metal interconnect connecting the PMOS and NMOS drains is electrically isolated from p-substrate and n-well by a field oxide and an interlevel dielectric layer. $TiSi_2$ is widely used in CMOS technology to form metal-semiconductor junctions to both n- and p-type silicon. Other metal-silicides can also be used for this purpose. With the subject structure, the interconnect can be in direct contact with n-well and p-substrate as shown in FIG. 2A. The interconnect along with n-well and p-substrate can form the Schottky junctions. During normal operating conditions for CMOS circuits, these Schottky junctions are reversed biased and/or turned off, effectively electrically isolating the interconnect from n-well and p-substrate. Accordingly, the isolation regions, which are typically made of dielectric materials such as the field oxide and interlevel dielectric layers, of the conventional structure are not necessary with respect to certain embodiments of the subject invention.

Figure 2F:
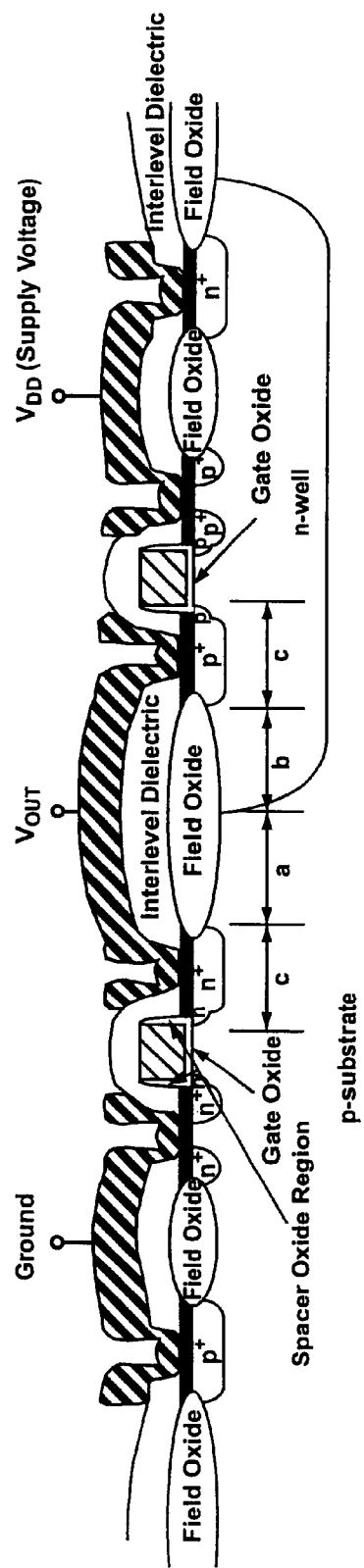
FIG. 2F shows a cross-section of a CMOS circuit having Schottky-clamped sources.
Figure 2G:
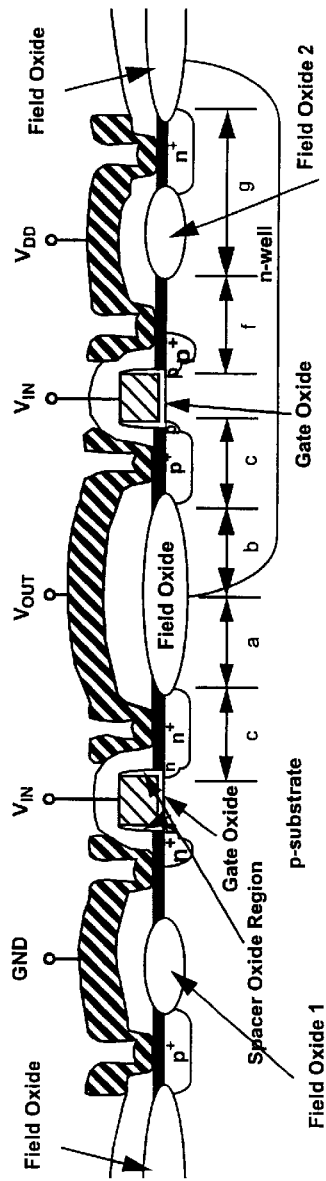
FIG. 2G shows a cross-section of a CMOS circuit having Schottky-clamped sources.
Figure 2H:
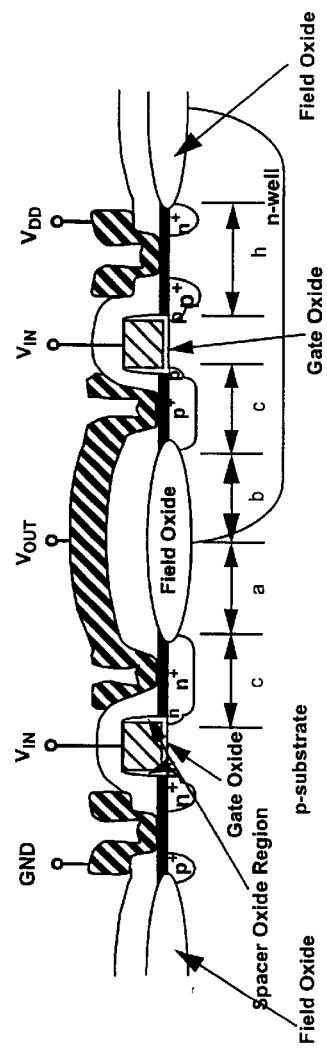
FIG. 2H shows a cross-section of a CMOS circuit housing Schottky-clamped sources.

In addition to the parasitic transistors associated with the drains, other transistors involved in latch-up include $n^+$source-p-substrate-n-well and $p^+$source-n-well-p-substrate parasitic bipolar transistors. Since in CMOS circuits, $n^+$-drain and $p^+$drain associated with the output node are typically connected together, when one of the $p^+$ drain-to-n-well and n⁺drain-to-p-substrate junctions is forward biased, the other is reverse biased. Accordingly, one of the parasitic transistors associated with the sources may be more critical with respect to the latch-up characteristics than the transistor associated with the reverse biased drain. The subject invention can improve latch-up immunity by decreasing the current gains of the parasitic transistors associated with the sources using a Schottky clamp as shown in FIGS. 2F, 2G, and 2H. If desired, this improvement can be traded off for smaller a+b which reduces the layout area. Additionally, the source-to-body junctions can be biased to 0 V, such that the reverse leakage typically associated with the Schottky clamped junctions can be greatly reduced. As the drain structures utilized in the embodiments shown in FIGS. 2F, 2G, and 2H are essentially the same as those of the conventional CMOS structures, the leakage performance for the structures with the Schottky clamped sources and conventional structures should be about the same. In addition, since the leakage is reduced, the ring around the field oxide edge can be removed, as shown in FIG. 2G, which can farther reduce the circuit area. Furthermore, the isolation region, or the field oxide island, between the body tie and source, referred to as Field Oxide 1 and Field Oxide 2 in FIG. 2G, can be eliminated to decrease the circuit area even more, as shown in FIG. 2H, such that fog is reduced to h.

A specific embodiment of the subject invention, a CMOS inverter, has been demonstrated in a 0.8 μm foundry CMOS process. The operation of this CMOS inverter is normal. No modifications of the foundry CMOS manufacturing process were necessary. It appears the area of CMOS inverters produced in accordance with the subject invention can be reduced by more than 30%. The subject inverter structure can be implemented using a pattern with simple modifications to the conventional inverter pattern. Accordingly, this invention can be used in conjunction with existing CMOS processes, allowing essentially immediate implementation of the subject invention with existing equipment and process technology.

As CMOS technology is advanced and scaled down, the Schottky junction area and perimeter associated with the subject circuitry will scale and reduce the leakage current associated with the reverse biased Schottky junctions. Furthermore, as the technology is scaled down, the drain-to-source and gate leakage current are expected to increase such that the Schottky junction leakage may become only a small part of the total leakage.

Following are examples which illustrate procedures for practicing the invention. These examples should not be construed as limiting.

EXAMPLE 1

Schottky Clamped Drain—MOSFET

A cross section of a specific device structure in accordance with the subject invention is shown in FIG. 1. The gate length and channel width are 0.8 and 12 μm, respectively. The SCDR transistors can be fabricated in a foundry 0.8-μm Salicide CMOS process similar to those in Peng et al. (S. Peng et al. [1990] "A manufacturable 2.0-micron pitch three-level-metal interconnect process for high performance 0.8-micron CMOS technology" *Proc. Symp. VLSI Tech*, June, pp. 25–26) and Chapman et al. (Chapman, R. A. et al. [1987] "A 0.8-μm CMOS technology for high performance logic applications" *IEDM Tech Dig.*, pp. 362–365), both of which are incorporated herein by reference. Implementation of the device can be accomplished with simple layout changes and therefore, does not require any process modifications. A major difference between conventional and SCDR transistors is that the SCDR devices can be asymmetric. Also, symmetric Schottky clamped SCDR devices are possible.

On the drain side, the source-drain implantation can be partially masked to form a $TiSi_2$—Si Schottky barrier contact and an n-type guard ring. The SCDR width is 12 μm and the length is 3.2 μm (see FIG. 1) with a 1.2-μm-wide n⁺ guard band along the polysilicon gate and a 0.8-μm-wide n⁺ guard band along the other three edges of the Schottky clamping diode. The n⁺ guard band along the polysilicon gate can act as a conventional drain. Along with this, a conventional source structure can be utilized to preserve the normal MOS transistor characteristics. In addition, the n⁺ guard band/ring at edges of the Schottky clamp can reduce electric fields at corners which in turn can reduce the reverse leakage and raise the breakdown voltage, while retaining normal Schottky barrier characteristics (Lepselter, M. P., S. M. Sze [1968] "Silicon Schottky Barrier diode with near-ideal I-V characteristics" *Bell Syts. Tech. J*. 47:195–208). In addition, at least in part due to the larger overall drain area, the junction capacitance of the SCDR should be higher than that of the conventional junction. These benefits can also be obtained for PMOS technology.

Figure 3A:
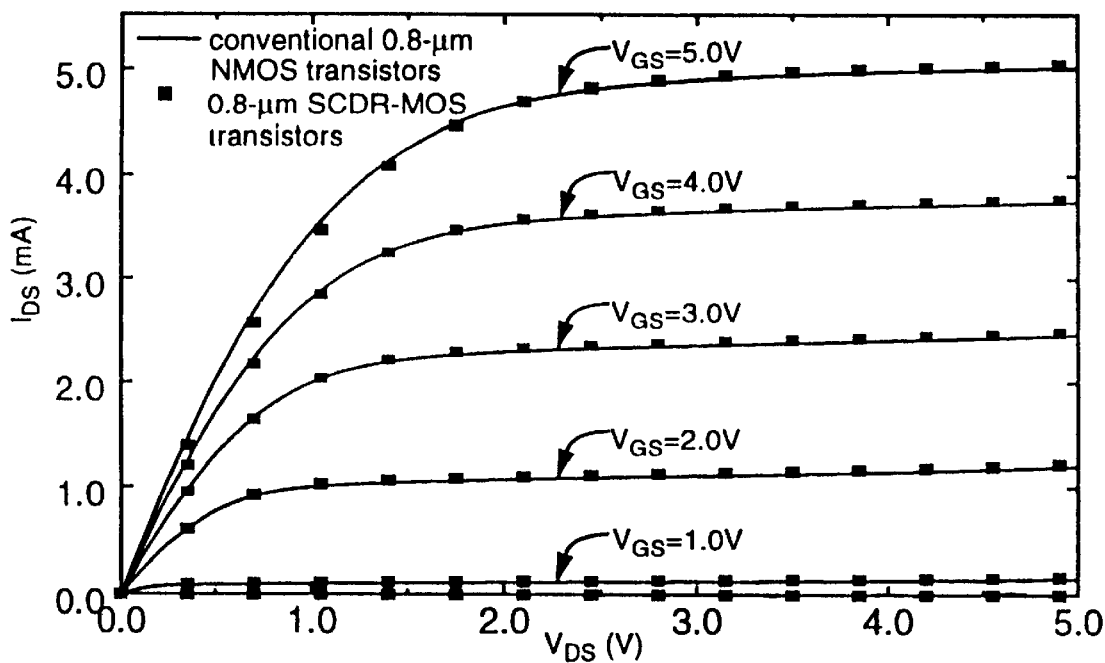
FIG. 3A shows the output I-V characteristics of a 0.8 $\mu$m Schottky-clamped-drain NMOS device in accordance with the subject invention and a standard NMOS device.
Figure 3B:
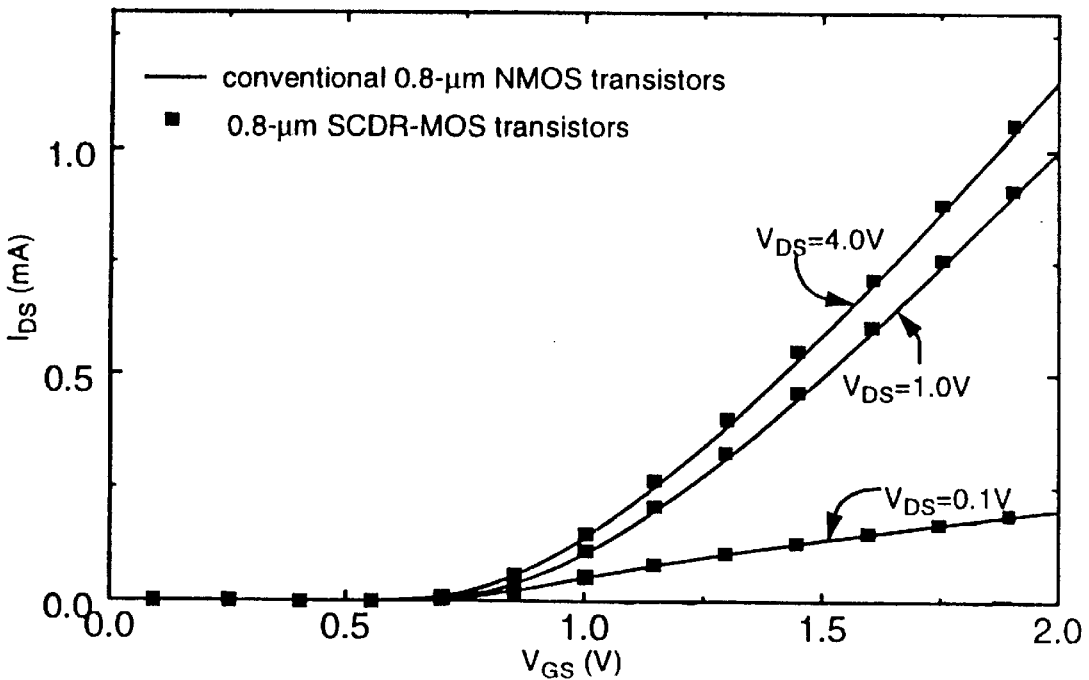
FIG. 3B shows $I_{DS}$ versus $V_{GS}$ curves of the transistors of FIG. 3A.
Figure 4:
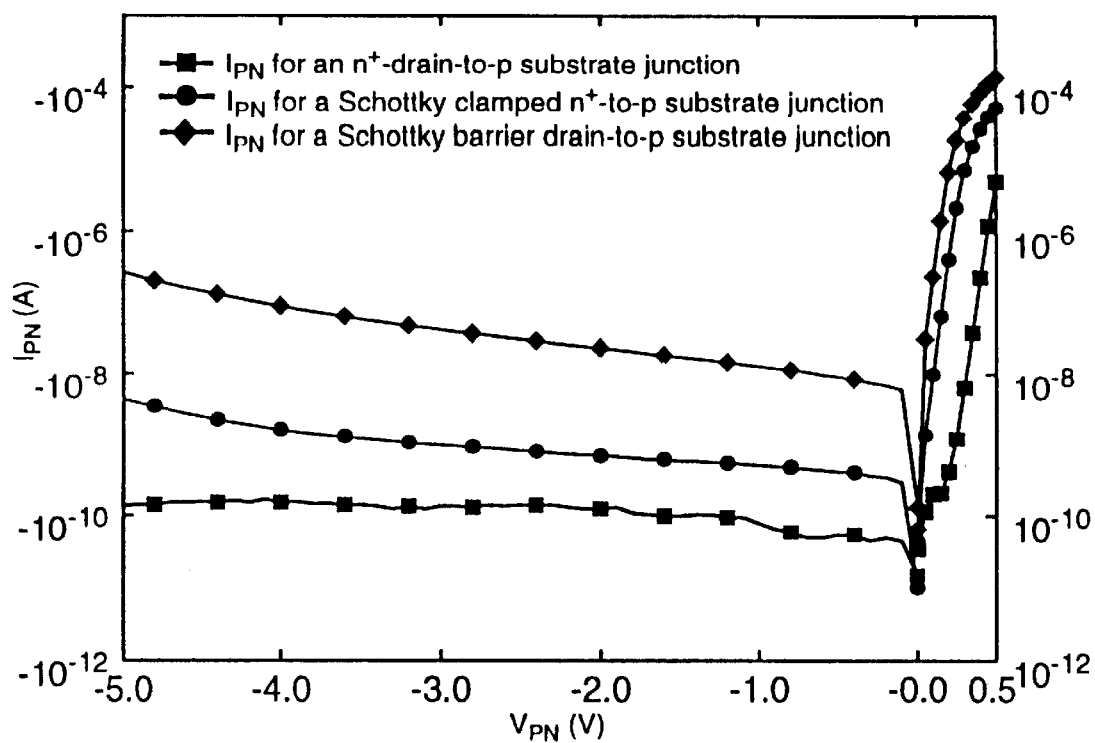
FIG. 4 shows the diode characteristics of $n^+$-drain-to-p-substrate Schottky clamped drain-to-p and Schottky drain-to-p-junction.

FIG. 3A shows output I-V characteristics of a 0.8-μm Schottky-clamped-drain in accordance with the subject invention and a standard NMOS device. FIG. 3B shows $I_{DS}$ versus $V_{GS}$ curves of the same transistors. The output and turn-on characteristics of the transistors are essentially identical. The subthreshold slope is about 100 mV/decade for both devices. FIG. 4 shows the forward and reverse characteristics of an n⁺-drain-to-p-substrate junction, a Schottky-barrier-drain-to-p junction (Huang, F. J., K. K. O [*1998*] "Schottky-Clamped NMOS Transistors Implemented in a Conventional 0.8-μm CMOS Process" *IEEE Electron Device Letters* 19(9):326–328), and a Schottky-clamped n⁺-drain-to-p-junction. Lengths and widths of these junctions are at the minimum for implementing respective MOSFET structures. For the Schottky barrier drain, the reverse leakage current at a 5 V reverse bias is 270 nA and the junction breakdown voltage is 6 V (Huang et al. [1997] supra). When the n⁺ guard band is added to form an SCDR, the reverse leakage current reduces to 4 nA and the junction breakdown voltage is increased to 14 V. These characteristics are much closer to those of conventional n⁺-drain-to-p-substrate junctions.

Figure 5:
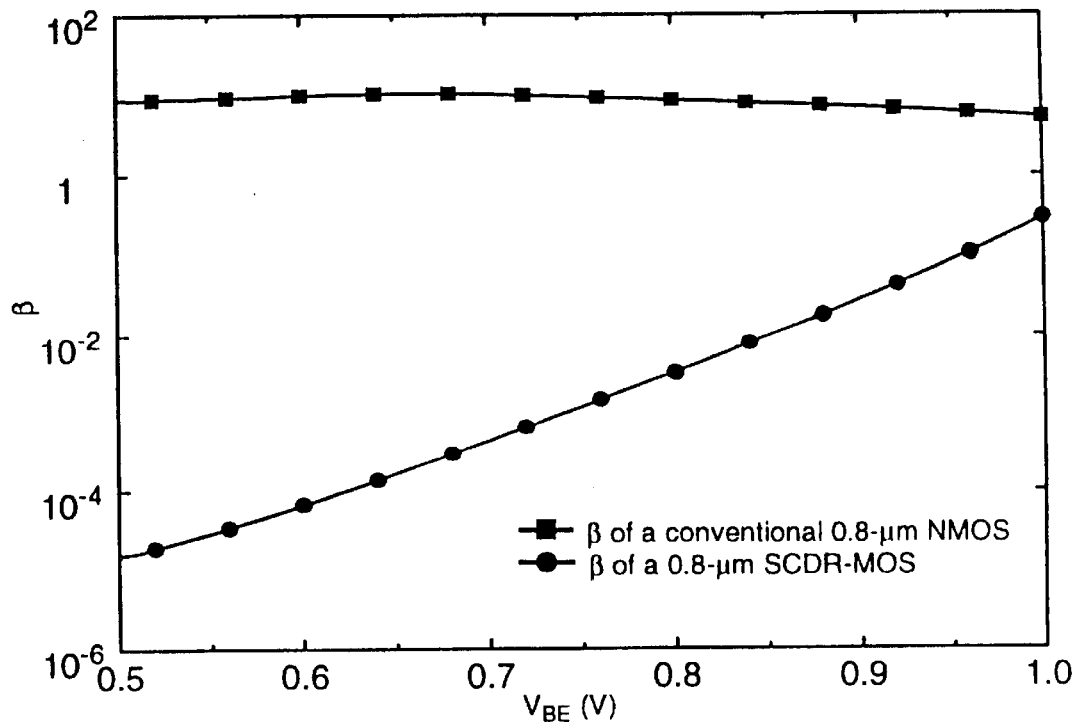
FIG. 5 shows current gain ($\beta$) verses $V_{BE}$ plots of drain-p-substrate-$n^+$-source parasitic n-p-n bipolar transistors for conventional and SCDR-MOS transistors.

FIG. 5 shows current gain (β) versus $V_{BE}$ curves of lateral drain/p-substrate/source parasitic structures for conventional and SCDR transistors. This structure is characterized instead of the drain/p-substrate/n-well parasitic structures, since this structure should have a higher current gain and should be a worse case. The lateral base width is 0.8 μm. As expected, the current gain of the SCDR transistors are significantly less than that of the conventional transistor. For $V_{BE}$'s ranging from 0 V to 1.0 V, the current gain is substantially less than the unity. At $V_{BE}$'s of 0.5 and 1.0 V, the current gains are $1.5 \times 10^{-5}$ and 0.3, respectively. These in turn should greatly reduce the latch-up susceptibility in integrated CMOS RF power amplifiers and switches.

For example, it is understood that the n⁺ and p⁺ doped regions may be generally reversed, depending upon whether the MOSFETs are formed on a p-type substrate, n-type substrate, n-well, or p-well. Also, the subject disclosure is presented in the context of MOSFETs for ease of presentation and understanding. However, the present invention is understood to apply to other field effect transistors such as MES (metal semiconductor) FETs.

EXAMPLE 2

Schottky Diode Clamped Merged Drain (SCMD) CMOS Structures

At least two factors limiting the packing density of CMOS circuits are (1) the area required to connect NMOS and PMOS drains in CMOS structures through contacts and a metal layer, and (2) the minimum spacing between n+ and p+ drains set by the latchup immunity and transistor isolation. A specific embodiment of the subject invention utilizes a TiSi$_2$—Si Schottky diode Clamped Merged Drain (SCMD) CMOS structure to address these factors in order to reduce CMOS circuit footprints. In a specific embodiment, the structure can be fabricated in foundry 0.8-$\mu$ and 0.5 $\mu$m Silicide CMOS processes. Output I-V characteristics of SCMD MOS transistors can be essentially identical to those of conventional MOS transistors, while decreasing the NMOS and PMOS drain length by, for example, about 60%. Advantageously, the current gaines of parasitic n$^+$-drain/p-substrate/n-well and p$^+$-drain/n-well/p-substrate bipolar transistors involved in latchup can be significantly reduced. This can enable a reduction of the n$^+$-to-p+ spacing while retaining acceptable transistor isolation.

Figure 6A:
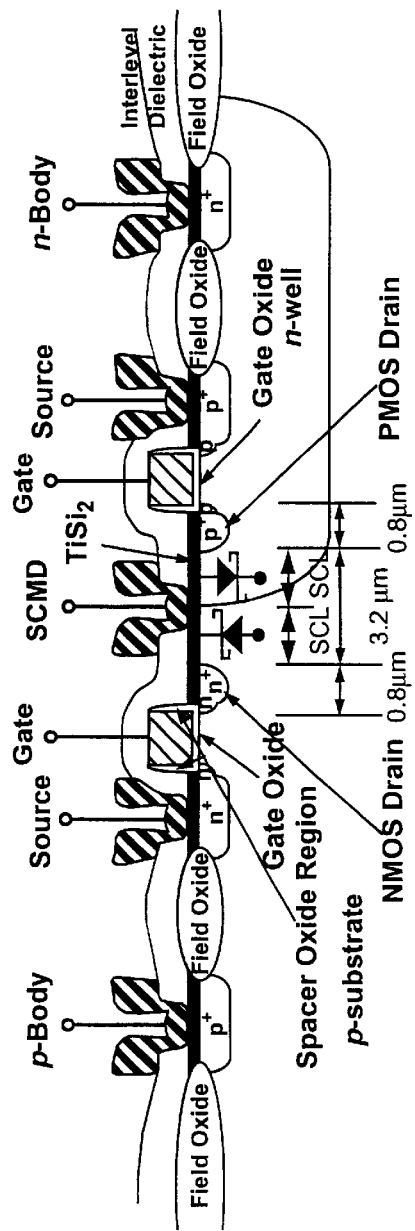
FIG. 6A shows a cross section of an SCMD CMOS structure in accordance with the subject invention.
Figure 6B:
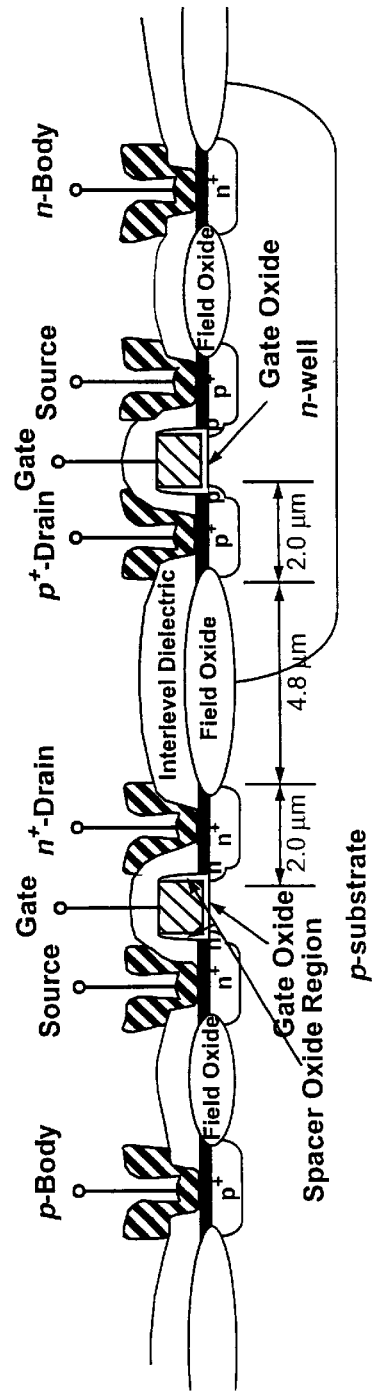
FIG. 6B shows a cross section of a conventional CMOS structure.
Figure 7A:
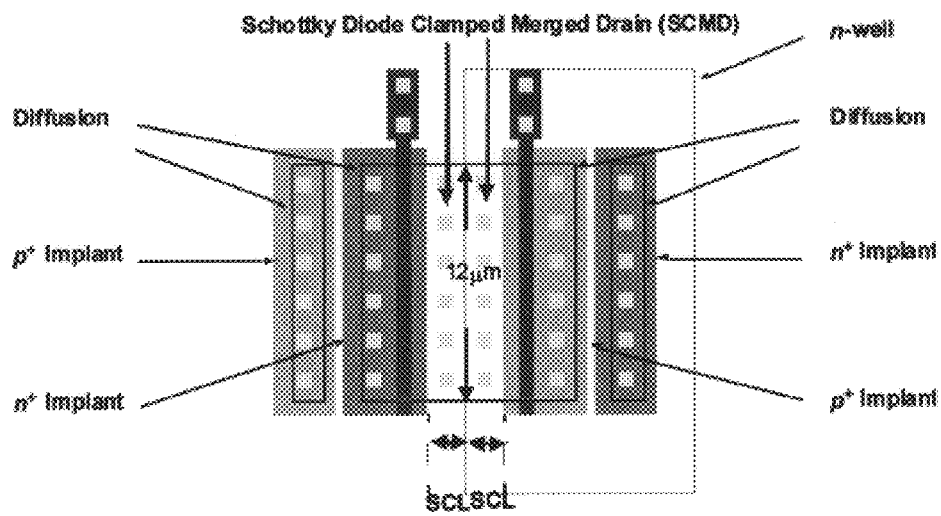
FIG. 7A shows a layout of an SCMD CMOS structure in accordance with the subject invention.
Figure 7B:
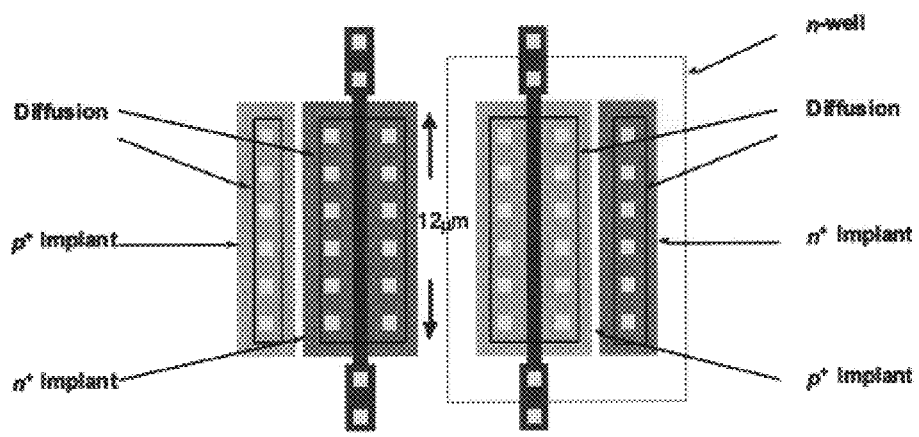
FIG. 7B shows a layout of a conventional CMOS structure.

FIGS. 6A and 6B show a cross section of a specific embodiment of an SCMD in accordance with the subject invention and a conventional CMOS structures. It should be noted that the body and source contacts are shown isolated as this was convenient for testing. As shown in FIGS. 2A and 2B, the body and source contacts can be shorted during use. The SCMD CMOS structure shown in FIG. 6A can be implemented with simple layout changes and with minimal process modifications as compared with the conventional CMOS structure shown in FIG. 6B. Layouts of SCMD and conventional CMOS structures are shown in FIGS. 7A and 7B respectively. The gate length and channel width are 0.8 $\mu$m and 12-$\mu$m, respectively. A major difference between SCMD and conventional MOS transistors is that on the drain side, the field oxide region between n$^+$ and p$^+$ drains is removed. The source/drain implantation was partially masked to form TiSi$_2$-n-Si and TiSi$_2$-p-Si Schottky barrier contacts, and n$^+$ and p$^+$ guard bands along the poly-silicon gates act as conventional drains for n-channel and p-channel devices, respectively. In the 0.8 $\mu$m CMOS process, the SCMD structure shown has a smaller drain length of 0.8 $\mu$m versus 2.0 $\mu$m, and has an n$^+$-to-p$^+$-drain spacing of 3.2 $\mu$m versus 4.8 $\mu$m for the conventional CMOS structure. These result in a ~30% area reduction for a CMOS inverter.

The area reduction of this SCMD CMOS structure is accomplished by exploiting the following: (1) TiSi$_2$ forms Schottky barrier junctions to both moderately doped n- and p-type silicon regions (doping concentration less than ~5×10$^{18}$ cm$^{-3}$) and TiSi$_2$ forms good ohmic contacts to n+ and p+ regions; (2) the lengths of n+ and p+ drains can be reduced to 0.8 from 2.0 $\mu$m, since using a TiSi$_2$ layer to connect the n+ and p+ drains eliminates the need for one of the two drain contacts in FIG. 6B and the remaining contact can be placed anywhere on the TiSi$_2$ layer; (3) because the TiSi$_2$ layer connecting the n+ and p+ drains forms reverse biased Schottky junctions to n-well and p-substrate, the TiSi$_2$ layer is electrically isolated from n-well and p-substrate, and this enables the removal of the field oxide region between the n+ and p+ drains in the conventional CMOS structure; (4) current gains of NMOS-drain/p-substrate/n-well (DPN) and PMOS-drain/n-well/p-substrate (DNP) parasitic bipolar transistors for Schottky clamped NMOS and PMOS transistors are reduced, which allows the spacing between n+ and p+ drains to be reduced to 3.2 from 4.8 $\mu$m without compromising the latchup immunity; (5) the BVCEO's of DPN and DNP bipolar transistors are ~19 and 13 V, respectively, and these are sufficiently high to provide good isolation between n+-drain and n-well, and between p+-drain and p-substrate even though the field oxide and field implanted regions are removed; and (5) the on-characteristics of the PMOS in SCMD CMOS structures are only slightly altered. Although this example utilizes Ti$_{Si2}$ which is commonly available in CMOS processes, the silicide does not have to be Ti$_{Si2}$. Other silicides, such as Co$_{Si2}$ which form Schottky junctions to n- and p-type silicon with comparable barrier heights as Ti$_{Si2}$ can also be used.

Figure 8A:
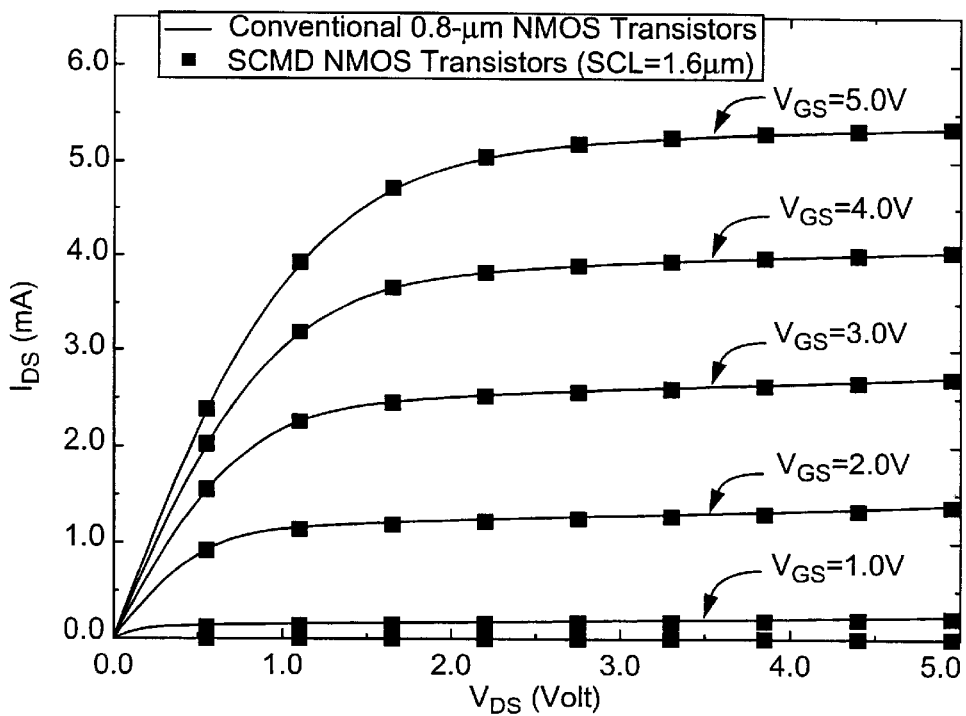
FIG. 8A shows measured IDS-VDS characteristics for a SCMD and a conventional NMOS transistors.
Figure 8B:
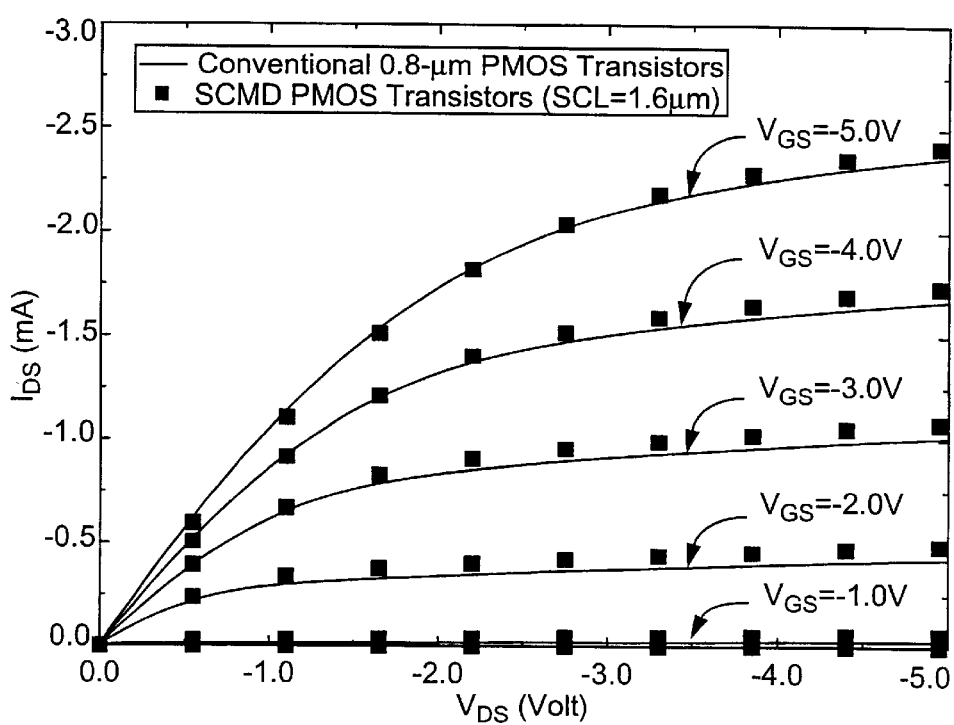
FIG. 8B shows measured IDS-VDS characteristics for a SCMD and a conventional PMOS transistors.
Figure 9:
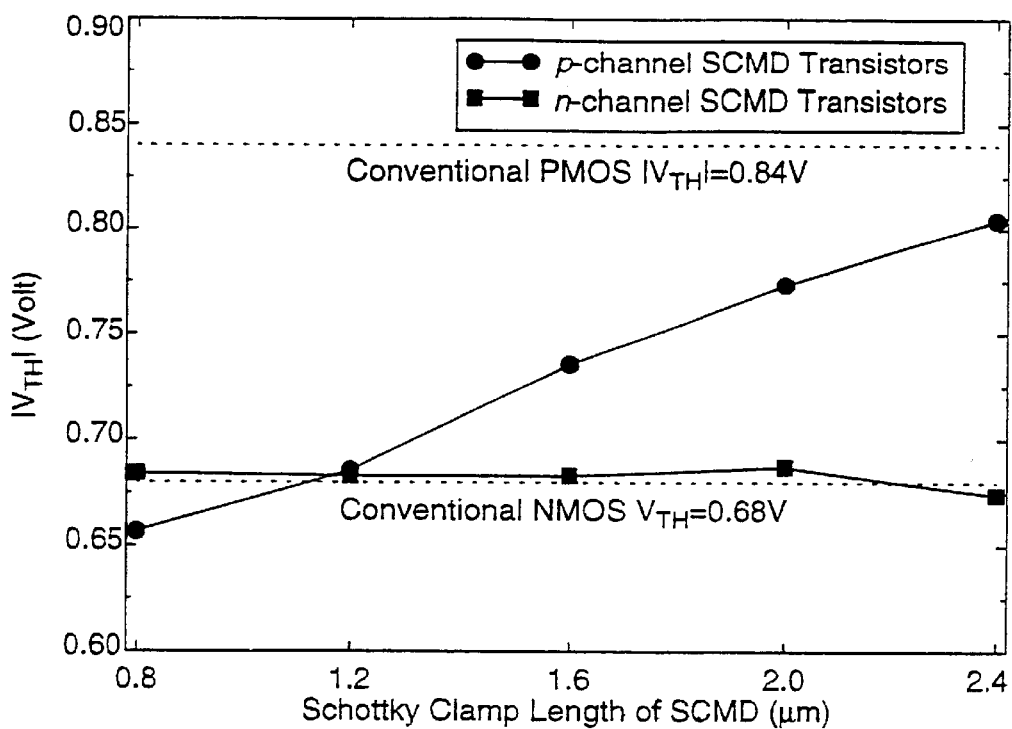
FIG. 9 shows the threshold voltage versus Schottky clamp length of SCMD NMOS and PMOS transistors.

FIGS. 8A and 8B show IDS-VDS characteristics of the SCMD and conventional NMOS and PMOS transistors. The Schottky clamp length (SCL, see FIGS. 6A and 7A) is 1.6 $\mu$m. Output characteristics of the conventional and the SCMD NMOS transistors are essentially identical. The SCMD PMOS transistor has slightly higher drain current than that for the conventional PMOS due to a 0.1-V increase of the threshold voltage caused by a decrease of the drawn PMOS channel to n-well edge spacing from 4.4 $\mu$m of the conventional structure to 2.4 $\mu$m. The threshold voltage of SCMD MOS transistors is one of the transistor parameters which deviate from those of conventional MOS transistors. FIG. 9 shows plots of $|V_{TH}|$ versus SCL for the NMOS and PMOS transistors. NMOS $|V_{TH}|$ is almost constant all the way down to SCL of 0.8 $\mu$m, while PMOS $|VTH|$ decreases to 0.66 V from 0.84 V when SCL is decreased to 0.8 $\mu$m. This higher threshold voltage of SCMD PMOS transistor could be an advantage for some applications where higher drive current is desired.

Figure 10:
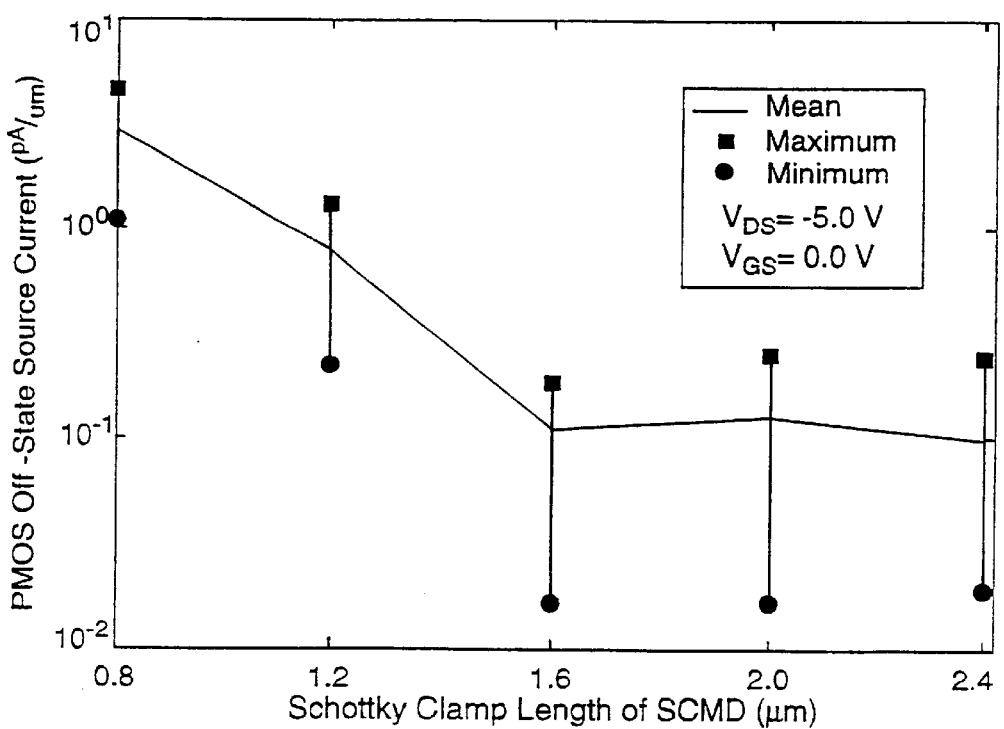
FIG. 10 shows the off-state source current versus Schottky clamp length for SCMD PMOS transistors.

FIG. 10 shows the SCMD PMOS transistor off-state source current. The off-current increases when SCL is reduced below 1.6 $\mu$m. Although ~3 pA/$\mu$m at an SCL of 0.8-$\mu$m is acceptable, for the off-state current to be independent of SCL, SCL should be greater than or equal to 1.6 $\mu$m. The off-state source current of PMOS transistors is ~0.1 pA/$\mu$m at VDS=-5 V when SCL is greater than or equal to 1.6 $\mu$m.

Figure 11:
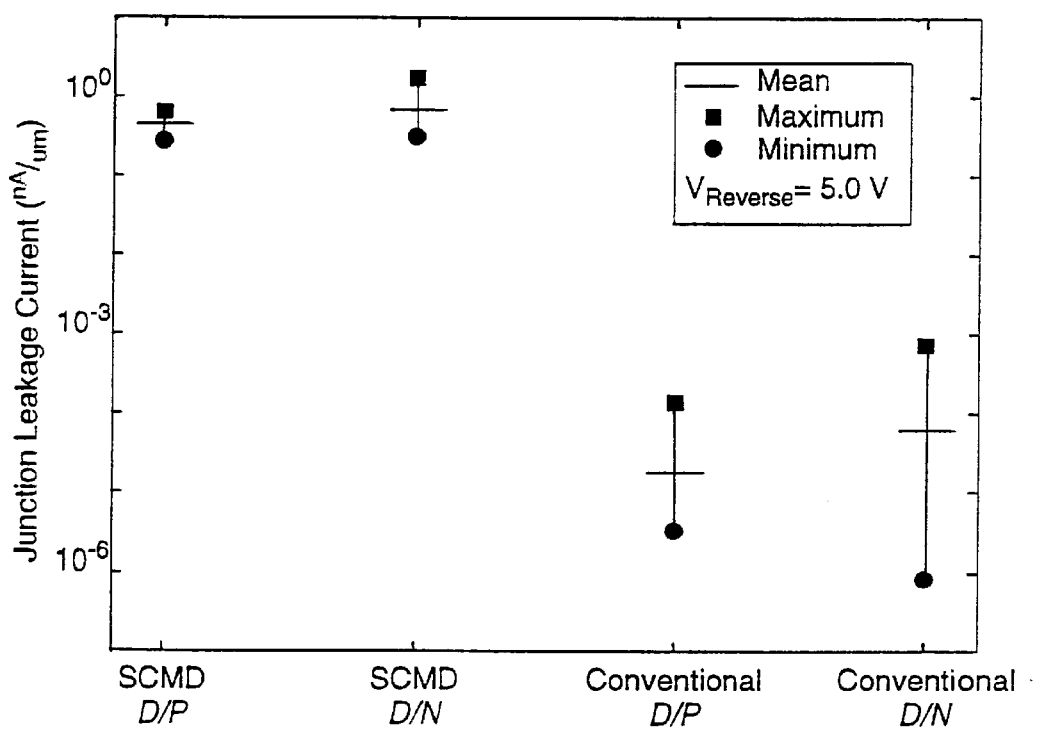
FIG. 11 shows the leakage currents of junctions in SCMD (SCL=2.0 um) and conventional CMOS transistors. (D: drain, N: n-well, P: p-substrate)

FIG. 11 shows the leakage currents of junctions in the SCMD and the conventional CMOS transistors. The leakage currents at room temperature for junctions in the SCMD transistors are ~1$^{nA}$/$\mu$m at a 5 volt reverse bias. This ~1$^{nA}$/$\mu$m leakage current of the SCMD junction is about 10 times higher than that of a Schottky clamped drain junction. For temperatures above 300° K, the leakage current of the Schottky clamped junctions doubles approximately every 10° K increase in temperature. Though the off-current of SCMD inverters is higher, the room temperature leakage is almost low enough to satisfy the off-state leakage current specification of CMOS technologies. Because of the presence of this more dominant leakage source, the increase in off-state source current to 3$^{pA}$/$\mu$m when SCL is reduced to 0.8 $\mu$m is not a significant factor.

The junction capacitance including the Schottky, p+-n and n+-p junctions of the SCMD structure should be ~10% higher than the conventional junctions. This corresponds to a ~3% increase in the load capacitance for each stage in an inverter chain with a fan-out of one. This appears to have negligible impact on the speed performance.

In order to maximize area reduction, the length of Schottky clamps is preferably as short as possible. However, it should not be too short. If the SCL is too short, the Schottky clamping effects may be lost, and the isolation between p+-drain and p-substrate and/or between n+-drain and n-well may be degraded below the acceptable limit. The minimum SCL is primarily impacted by two factors, the transistor isolation and the parasitic bipolar current gain. The shortest SCL in this example is 0.8 μm which is limited by the lateral diffusion of n-well and drain implants. The longest SCL is 2.4 μm which corresponds to the drain-to-n-well spacing for the conventional CMOS structure.

Figure 12:
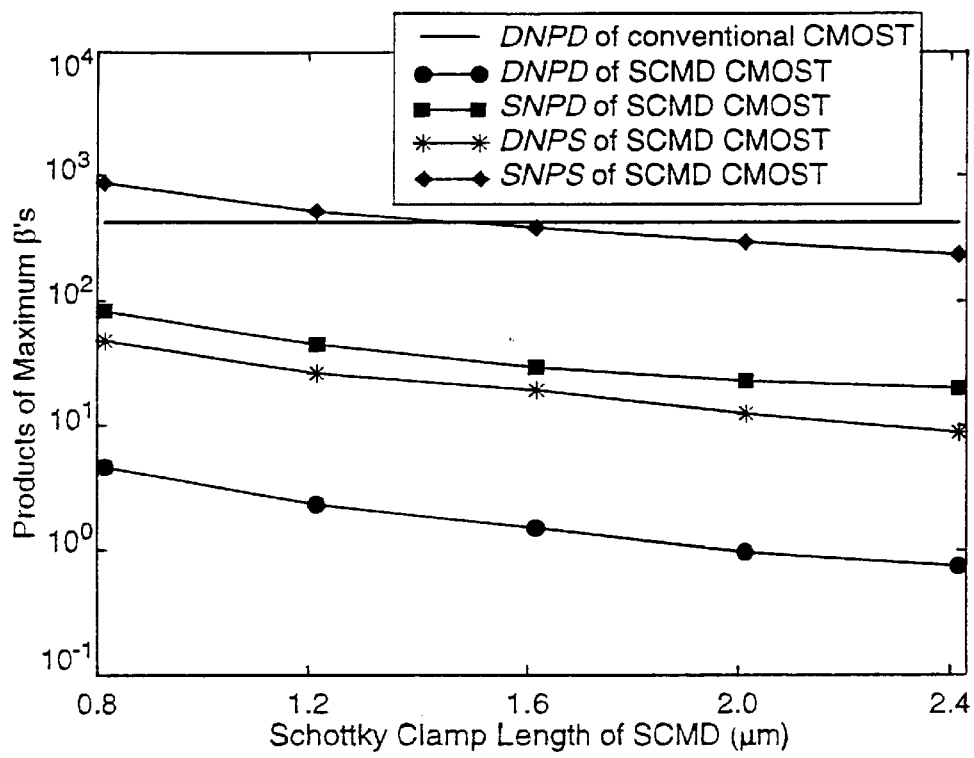
FIG. 12 shows the products of maximum current gains (max($\beta$NPN)×max($\beta$PNP)) for conventional and SCMD CMOS structures versus Schottky clamp length (SCL). (D: drain, S: source, N: n-well, P: p-substrate).

FIG. 12 shows the products of maximum current gains (max($\beta_{NPN}$)×max($\beta_{PNP}$)) versus SCL of SCMD for all the possible PNPN thyristor combinations which could trigger latchup. The drains serve as the emitters of the bipolar transistors. The parasitic DPN and DNP bipolar actions in the CMOS structure are greatly reduced since Schottky barrier junctions, which do not inject minority carriers, clamp the n+-drain-to-p-substrate and p+-drain-to-n-well junctions. These, in turn, reduce current gains of the parasitic DPN and DNP transistors, and lead to significantly reduced latchup susceptibility. This improvement in latchup immunity can be traded-off to reduce the n+-drain-to-p+-drain diffusion spacing. As SCL decreases, the products of maximum b's increase. However, they are still much lower than those of the conventional CMOS structure except for the product of the p+-source/n-well/p-substrate/n+-source (SNPS) thyristor. The SNPS is structurally the same as the conventional CMOS parasitic PNPN thyristor except for the smaller spacings in the SCMD structure. To ensure that this product is less than those of the conventional CMOS structure, SCL should preferably be at least 1.6 μm compared to 2.4 μm in the conventional CMOS structure. However, a smaller SCL can be achieved by Schottky clamping the NMOS and PMOS sources, without changing the I-V characteristics of the transistors.

Figure 13:
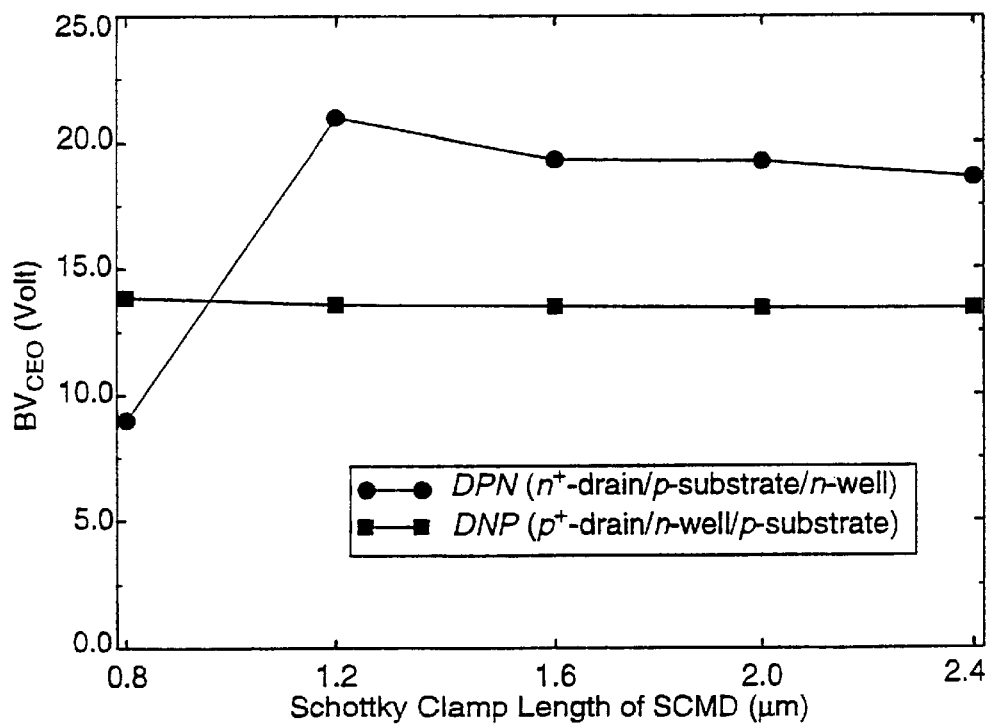
FIG. 13 shows the $BV_{CEO}$ of parasitic DPN (n+-drain/p-substrate/n-well) and DNP (p+-drain/n-well/p-substrate) bipolar transistors of SCMD CMOS transistors.

In FIG. 13, $BV_{CEO}$'s of the parasitic DNP bipolar transistors of the SCMD inverter remain constant for SCL's ranging between 0.8 and 2.4 μm. For the DPN transistors, $BV_{CEO}$ decreases sharply when SCL is reduced below 1.2 μm. These $BV_{CEO}$ characteristics impact the minimum SCL between n+and n-well to 1.2 μm and that between p+ and p-substrate to 0.8 μm. As shown in FIG. 6B, these spacings are 2.4 μm in the conventional structure.

Figure 14:
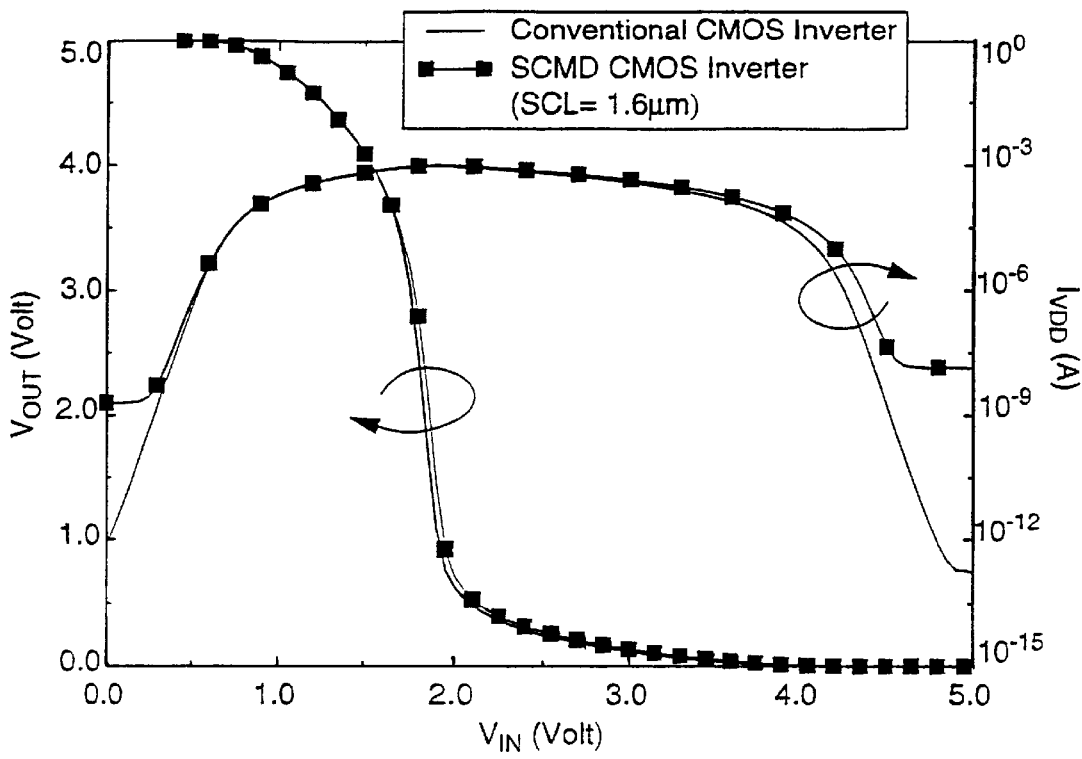
FIG. 14 shows the voltage transfer curves and supply currents for SCMD and conventional CMOS inverters. (WPMOS=WNMOS=12 $\mu$m).

To demonstrate the applicability of the SCMD structure, SCMD CMOS inverters and a 100-stage inverter chain have been implemented. FIG. 14 shows the voltage transfer characteristics (VTC) and supply currents of conventional and SCMD CMOS (SCL=1.6 μm) inverters with PMOS Width=NMOS Width=12 μm. The VTC curves are almost identical. The slight shift is due to the difference in the PMOS threshold voltage. However, the supply current of the SCMD inverter at output voltages of 0 and 5 V are significantly higher than those of conventional CMOS inverters. This is mainly due to the junction leakage current of the Schottky clamped junctions as shown in FIG. 11.

Figure 15:
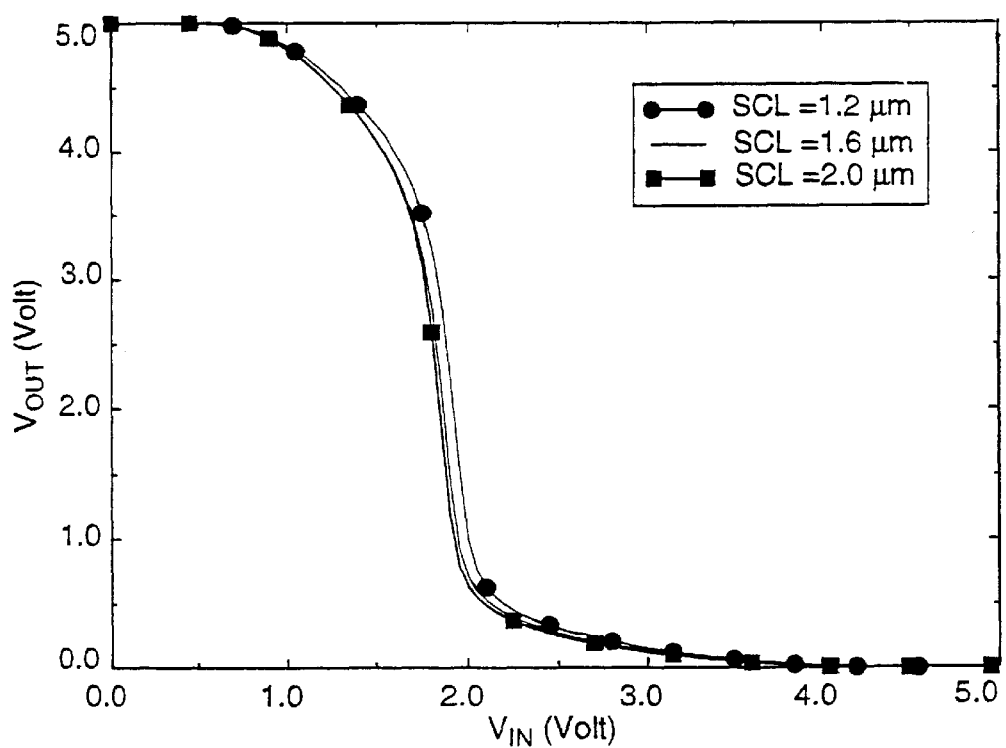
FIG. 15 shows the voltage transfer curves of SCMD inverters for varying Schottky clamp lengths.

FIG. 15 shows VTC curves for inverters with varying SCL. Due to the PMOS VTH shift, when SCL is decreased to 1.2 μm, the inverter switching point is increased by ~80 mV. Based on these discussions and those from the previous section, SCL between the n+ and n-well and that between the p+ and p-substrate can be reduced to 1.6 μm without affecting the circuit, latchup, and transistor isolation characteristics. If higher PMOS VTH can be tolerated, the SCL widths set by the $BV_{CEO}$ limitation can be used to further reduce the inverter area.

Figure 16A:
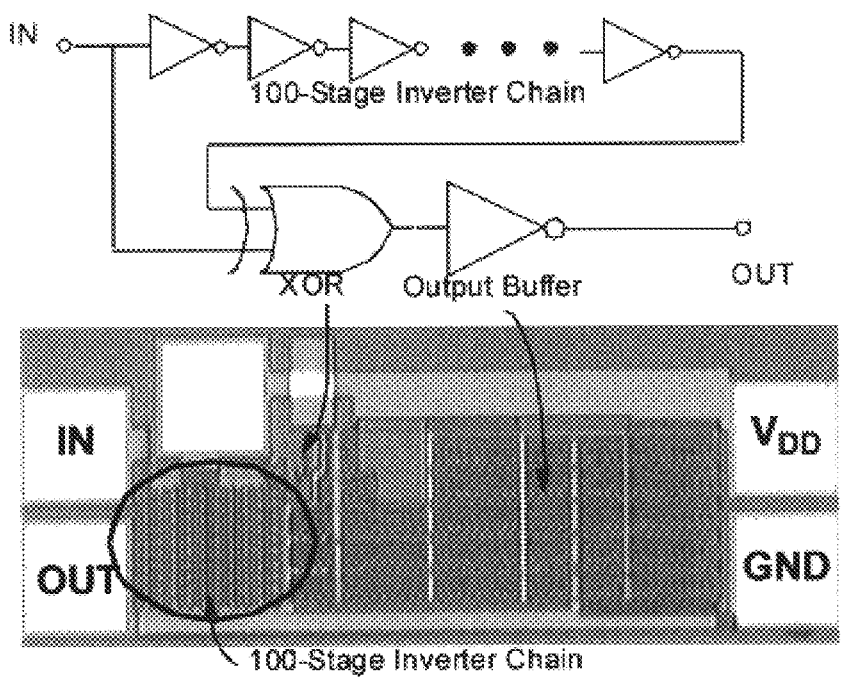
FIG. 16A shows a circuit schematic and a die photo for the SCMD CMOS inverter chain and propagation delay extraction circuit.
Figure 16B:
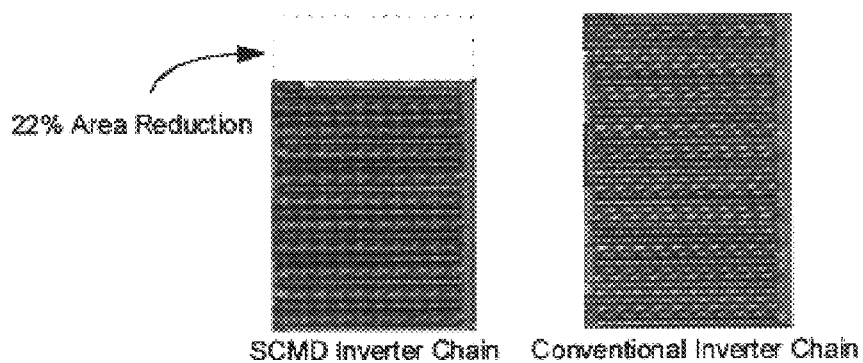
FIG. 16B shows enlarged photos of the SCMD and conventional CMOS inverter chains for clear area comparison.
Figure 17A:
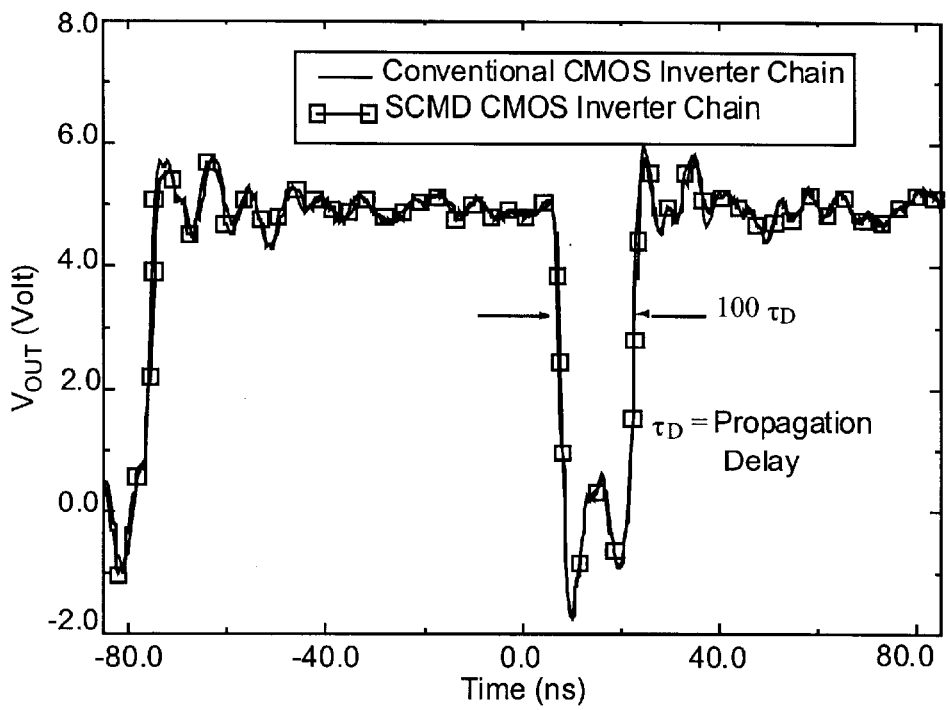
FIG. 17A shows measured output waveforms of the SCMD and conventional CMOS circuits shown in FIGS. 16A and 16B.
Figure 17B:
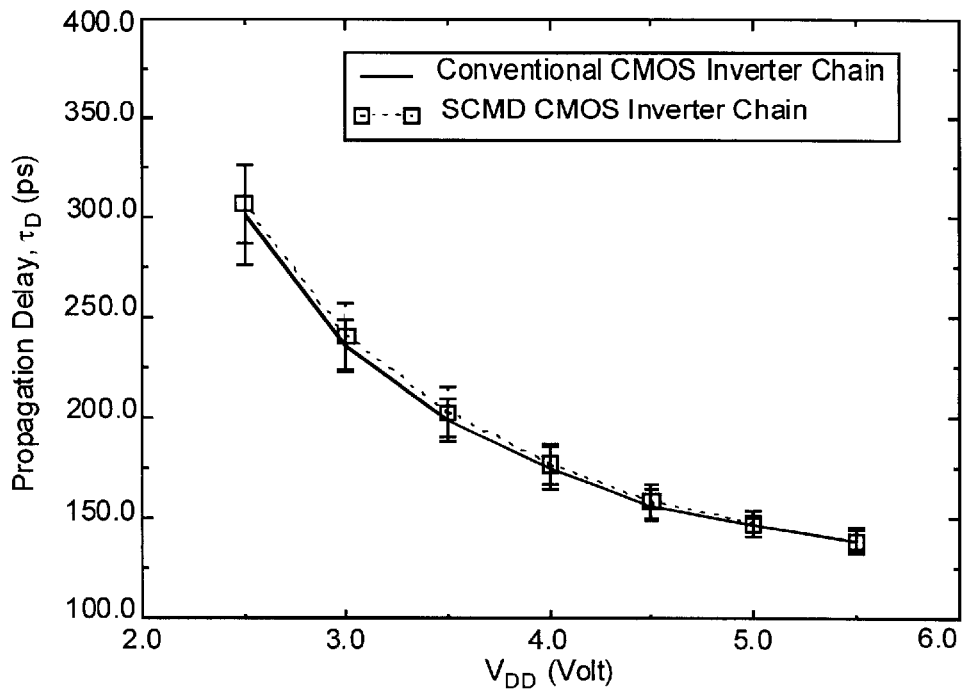
FIG. 17B shows inverter delays vs. supply voltage for the SCMD and conventional CMOS inverters.

100-stage CMD (SCL=2.0 μm) and conventional CMOS inverter chains with NMOS Width=1.6 μm and PMOS Width=3.2 μm have been implemented. FIG. 16A shows the schematic and a micro-photograph of the inverter chain and delay extraction circuit. The chain for the SCMD and conventional CMOS inverters are enlarged and shown in FIG. 16B for clear area comparison. By utilizing the SCMD structure, the inverter chain area (SCL=2.0 μm or n+-drain-to-p+-drain spacing of 4.0 μm) has been reduced by ~22%. FIG. 17A shows output waveforms of the inverter chains. FIG. 17B shows plots of the inverter propagation delay ($\tau_D$) versus supply voltage. The plots for both types of inverters are almost identical. As discussed, the junction capacitance including the Schottky, p+-n and n+-p junctions of the SCMD structure should be ~10% higher than those for the conventional junctions. This corresponds to a ~3% increase in the load capacitance for each stage in an inverter chain with a fan-out of one. As seen in FIG. 17A, this appears to have negligible impact on the speed performance.

By utilizing SCL=2.0 μm or n+-drain-to-p+-drain spacing of 4.0 μm, the inverter chain area has been reduced by ~22% without any process modifications. As mentioned earlier, SCL's between the n+and n-well and between the p+ and p-substrate can be reduced to 1.6 μm without affecting the circuit, latchup, and transistor isolation characteristics. This would increase the area reduction to ~30%. If higher VTH for PMOS transistors can be tolerated and if the sources of NMOS and PMOS transistors are Schottky clamped, then by using PMOS SCL=0.8 μm and NMOS SCL=1.2 μm, the area of the SCMD inverter chain can be made ~40% smaller than that for a conventional inverter chain.

The SCMD CMOS structures have also been implemented in a foundry 0.5-μm CMOS process. Similar to the results for the 0.8-μm SCMD MOS transistors, output I-V and isolation characteristics of the 0.5-μm SCMD MOS transistors are almost identical to those of conventional MOS transistors, while the current gains of parasitic n+-drain/p-substrate/n-well and p+-drain/n-well/p-substrate bipolar transistors involved in latchup are also significantly reduced. More importantly, the percentage area reduction remains the same although the technology is scaled to 0.5-μm.

EXAMPLE 3

Schottky Clamped (SC) MOS Transistors

Figure 18A:
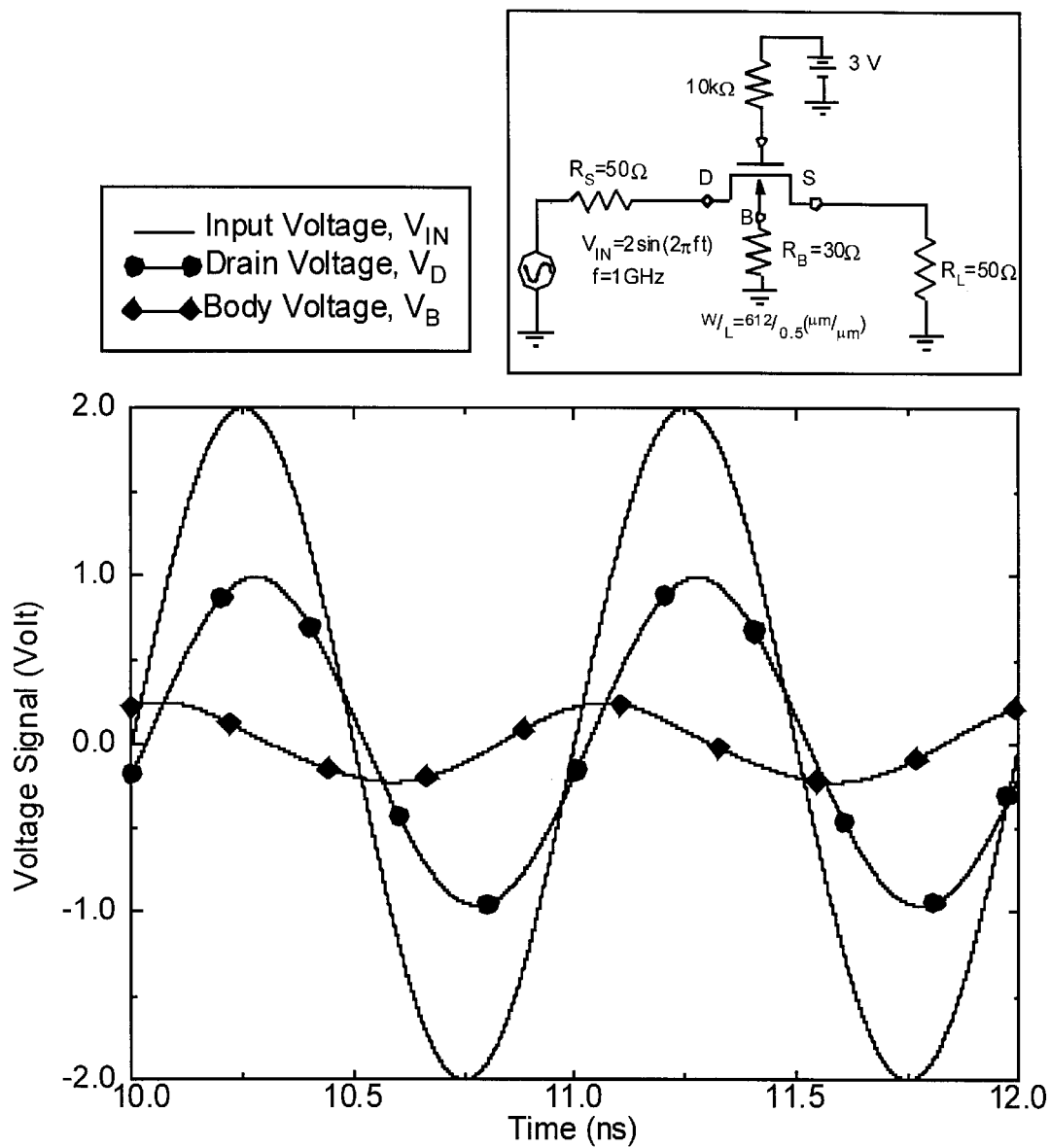
FIG. 18A shows simulated waveforms of voltages in a MOS transistor switch with 10-dBm available power from the source.
Figure 18B:
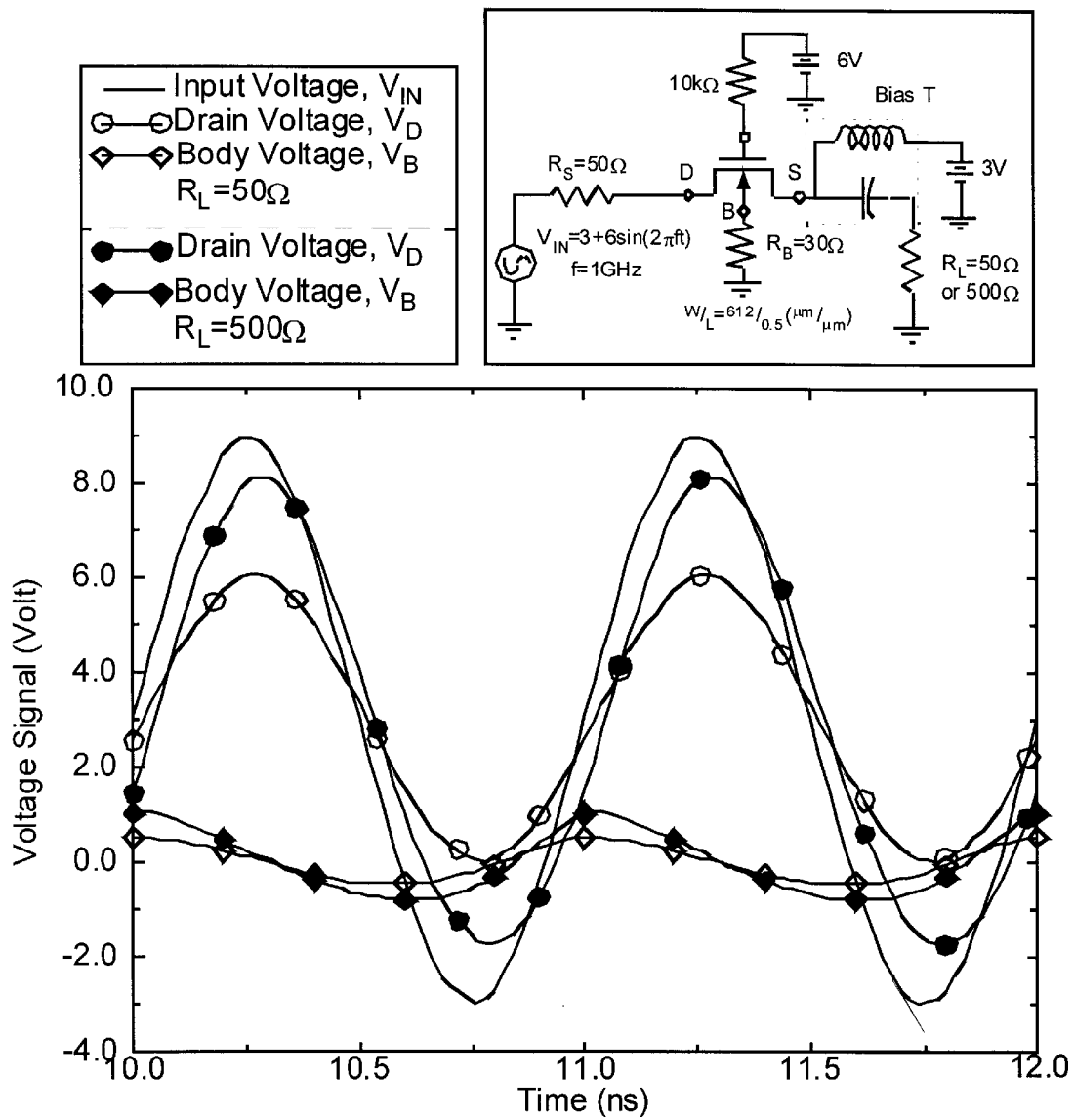
FIG. 18B shows simulated waveforms of voltages in a MOS transistor switch with reverse biased source/drain-to-body junctions (3V) when the load impedance is mismatched to the source impedance (VSWROUT=10:1).

In MOS RF switch applications, especially when the supply voltage is low, the drain nodes of some transistors can swing below GND or above $V_{DD}$ when the input Radio-Frequency (RF) power level is high. Unfortunately, when a switch is integrated with other circuits this can forward bias source/drain-to-body junctions and may trigger latchup. Simulation results for a simple MOS transistor switch shown in FIGS. 18A and 18B illustrate this problem. The NMOS source/drain-to-body junctions are forward biased when the signal at source/drain swings below the body signal as shown in FIG. 18A. This problem can be alleviated by applying DC bias to increase the reverse bias of the source/drain-to-body junctions. This increases the AC voltage amplitude required to forward bias the junction and thus improves the power handling capability. Normally, a transmit/receive (T/R) switch is connected to an antenna, which has a nominal input impedance of 50 W. However, this impedance can change with surrounding structures. Because of this, the switch should preferably survive even when the output load is mismatched (<10:1 VSWR). For instance, when the output load is 500Ω, VSWR is 10:1. FIG. 18B shows the output voltage when the load is 50 and 500Ω with a 3.0-V reverse biased source/drain-to-body junctions. Under the 50Ω load condition, source/drain-to-body junctions are never forward biased. However, for the same input voltage, when the load is 500Ω, the source/drain-to-body junctions are forward biased in a portion of a cycle, which can trigger latchup. A similar situation exists for RF power amplifiers. A method is needed to reduce latchup susceptibility in CMOS circuits with an integrated RF switch and a power amplifier.

A specific embodiment of the subject invention relates to a transistor structure called Schottky clamped MOS transistors for RF T/R switch and power amplifier applications. If only the drain is Schottky clamped, the structure can be referred to as a Schottky Clamped DRain (SCDR) MOS transistor. If both the source and drain are clamped, the structure can be referred to simply as a Schottky Clamped (SC) MOS transistor. This Schottky clamped structure can radically reduce latchup susceptibility while achieving the same drive current and similar frequency responses as conventional MOS transistors. Implementation of SC and SCDR MOS transistors can be accomplished with changes, and minimal, if any, process modifications. The structure is demonstrated in 0.8-um, 0.5-um and 0.25-um foundry Silicide CMOS processes. The parasitic NMOS-drain/p-substrate/n-well (DPN) and PMOS-drain/n-well/p-substrate (DNP) bipolar transistor actions of CMOS technologies are greatly reduced by using the SC or SCDR structures since Schottky barrier diodes which do not inject minority carriers clamp the drain-to-body junctions. Current gains of the parasitic DPN or DNP bipolar transistors, in turn, are significantly less than those of conventional MOS transistors. It should be possible to use this type of structures to radically lower latchup susceptibility and even possible to completely eliminate latchup in CMOS technologies. The SC and SCDR transistors also suffer significantly less from the high drain-to-body leakage currents and low breakdown voltages of MOS transistors using Schottky barrier drains. Guard band structures can be utilized to reduce reverse leakage currents and raise the breakdown voltages typically associated with Schottky barrier diodes.

Figure 19:
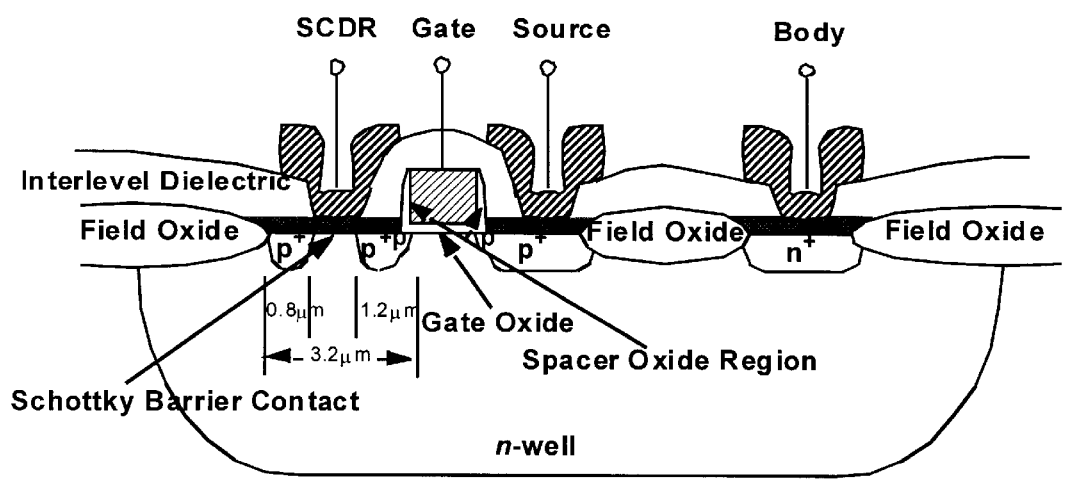
FIG. 19 A cross-section of an SCDR PMOS transistor.

A cross section of an SCDR NMOS device structure is shown in FIG. 19A. In a 0.8-um CMOS process, the gate length and channel width are 0.8-um and 12-um, respectively. As stated earlier, implementation of the devices can be accomplished with simple layout changes and minimal, if any, process modifications. A major difference between SCDR and conventional NMOS transistors is that on the drain side, the source/drain implantation can be was partially masked to form a TiSi$_2$—Si Schottky barrier contact and an n-type guard ring. In the 0.8-um CMOS process, the SCDR width is 12-um and the length is 3.2-um (see FIG. 19A$a$) with a 1.2-um wide n+ guard band along the polysilicon gate and 0.8-um wide n+ guard bands along the other three edges of the Schottky clamping diode. The n+ guard band along the polysilicon gate can act as a conventional drain. The n+ guard band/ring at edges of the Schottky clamp can reduce electric fields at the corners which in turn reduces the reverse leakage current and raises the junction breakdown voltage while retaining normal Schottky barrier diode characteristics.

A cross section of an SCDR PMOS transistor is shown in FIG. 19B. The basic structure of SCDR PMOS and NMOS transistors are the same. The channel length and width are 0.8-um and 12-um, respectively. Like the SCDR NMOS transistor, on the drain side, the source/drain implantation can be partially masked to form a Ti$_{Si2}$—Si Schottky barrier contact and p-type guard rings for SCDR PMOS transistors. Once again, the SCDR width is 12-um and the length is 3.2-um (see FIG. 19B) with a 1.2-um wide p+ guard band along the polysilicon gate and 0.8-um wide guard bands along the other three edges of the Schottky clamping diode. Like the SCDR NMOS transistor, the guard band along the polysilicon gate acts as a conventional drain.

The structure of SC MOS transistors is the same as those of SCDR MOS transistors except the source side of SC MOS transistors also utilized the Schottky clamped structure. For SC transistors, the guard band along the polysilicon gate can act as a conventional source preserving the normal turn-on characteristics of MOS transistors.

Figure 20A:
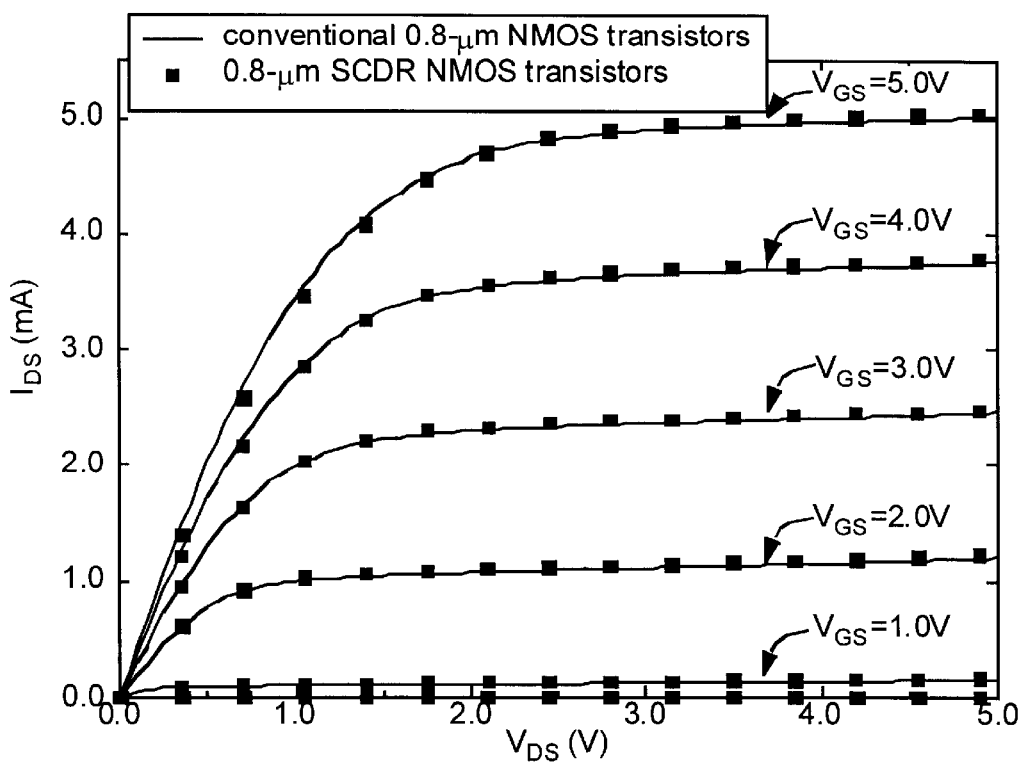
FIG. 20A shows measured IDS-VDS characteristics for n-channel conventional and SCDR MOS transistors.
Figure 20B:
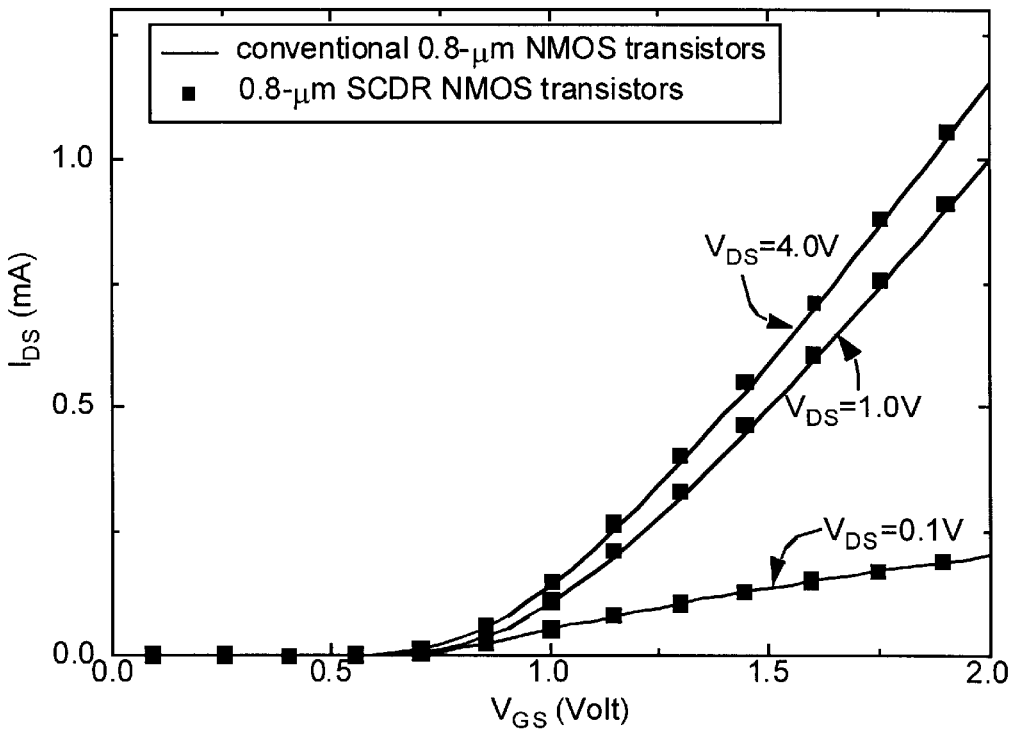
FIG. 20B shows measured IDS-VGS characteristics for n-channel conventional and SCDR MOS transistors.
Figure 21A:
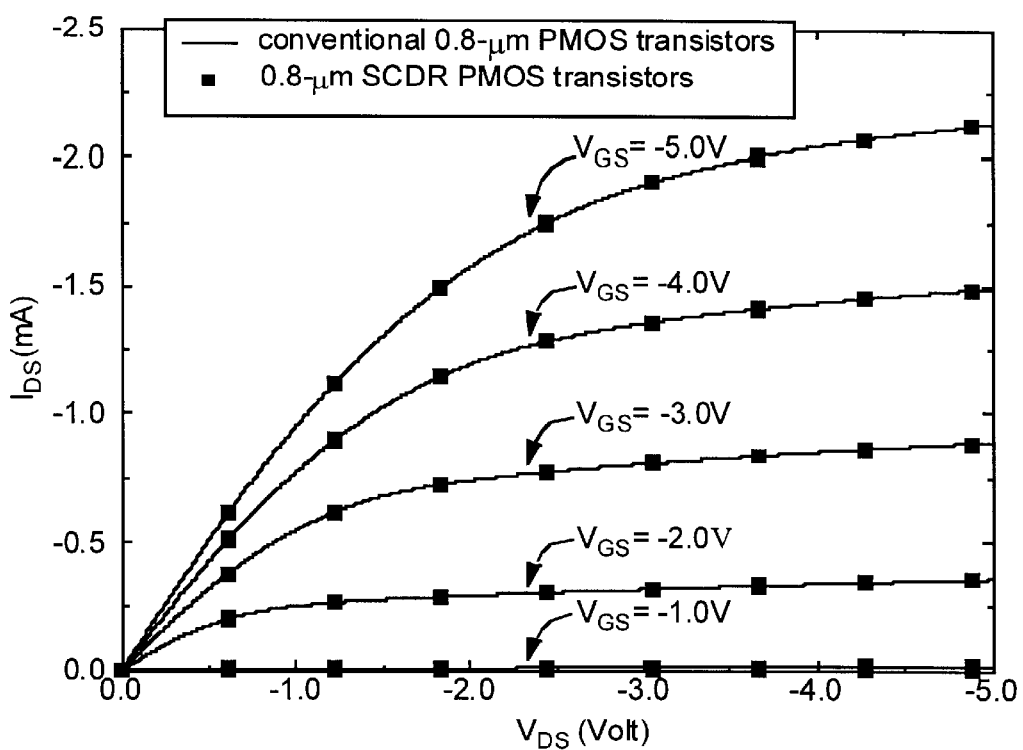
FIG. 21A shows measured IDS-VDS characteristics for p-channel conventional and SCDR MOS transistors.
Figure 21B:
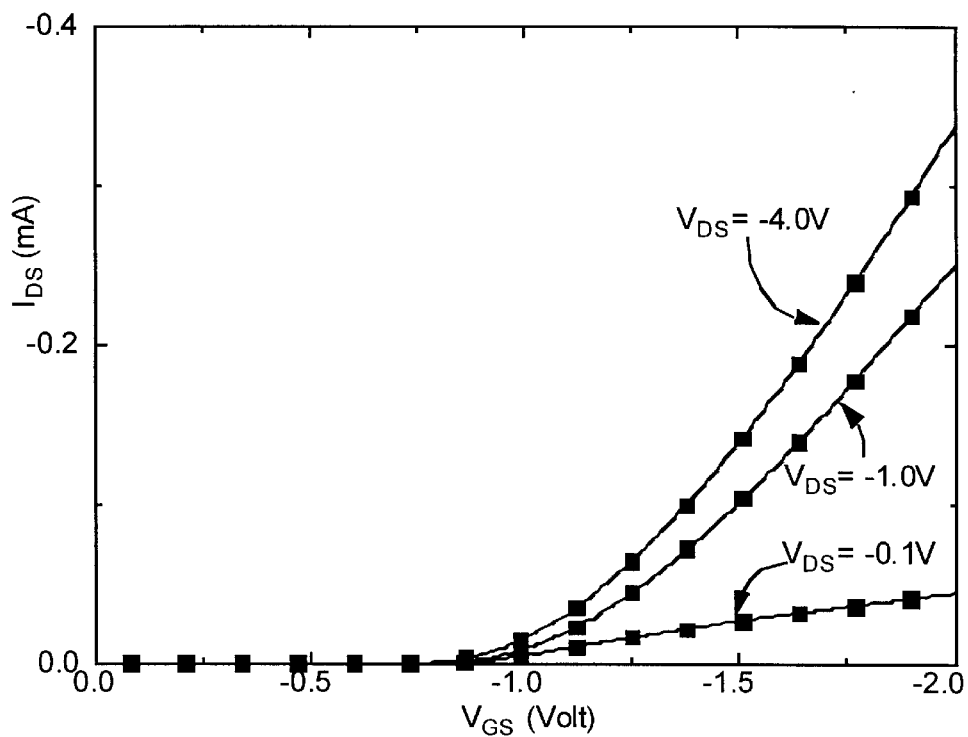
FIG. 21B shows measured IDS-VGS characteristics for p-channel conventional and SCDR MOS transistors.

FIG. 20A shows output I-V characteristics of 0.8-um SCDR and conventional NMOS devices. FIG. 20B shows $I_{DS}$ VS. $V_{GS}$ curves of the same transistors. The output and turn-on characteristics of the SCDR NMOS transistors are identical to those of conventional NMOS transistors. The subthreshold slope is about $100^{mV}/_{decade}$ for both devices. FIGS. 21A and 21B show output I-V and turn-on characteristics of 0.8-um SCDR and conventional PMOS devices, respectively. Like the SCDR NMOS transistor, the output and turn-on characteristics of the SCDR PMOS transistors are identical to those of conventional PMOS transistors. The subthreshold slope is also about 100 mV/decade for both SCDR and conventional PMOS transistors. Although data are not shown here, SC NMOS and PMOS transistors have also been fabricated. As expected, the characteristics of these transistors were also the same as the conventional MOS transistors.

Figure 22A:
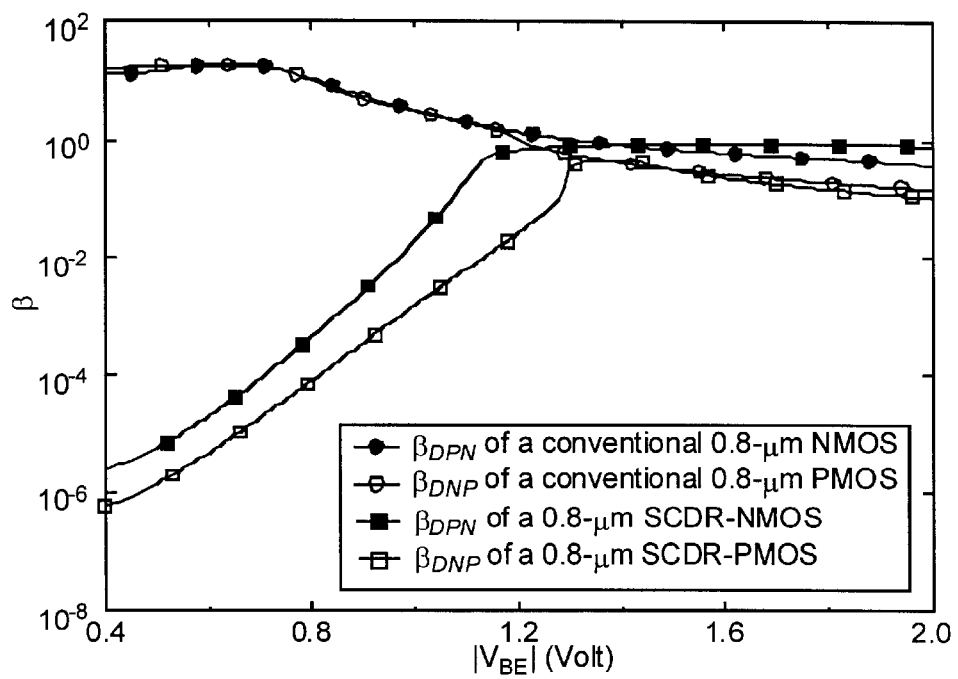
FIG. 22A shows current gain ($\beta$) vs. $|V^{BE}|$ plots of drain/p-substrate/n-well ($\beta$DPN) and drain/n-well/p-substrate (bDNP) parasitic bipolar transistors for the SCDR and conventional CMOS structures.

To demonstrate the reduction in latchup susceptibility in SC and SCDR structures, current gains (b) of parasitic bipolar transistors in CMOS structure using SCDR transistors are compared to those using conventional transistors. FIG. 22A shows β versus $|V_{BE}|$ curves of NMOS-drain/p-substrate/n-well (DPN) and PMOS-drain/n-well/p-substrate (DNP) parasitic bipolar transistors for the SCDR and conventional CMOS structures. The drains serve as the emitters of the bipolar transistors. The bipolar structures were constructed using the minimum n+-to-n-well (2.4 um) and p+-to-p-substrate (2.4 um) spacings allowed by the given process design rules. As expected, for $|VBE|$'s ranging from 0 V to 1.2 V, current gains of the SCDR structure are significantly less than those of the conventional transistors. For $|VBE|$'s ranging from 0 V to 2.0 V, βDPN and βDNP for the SCDR structure are substantially less than the unity. For VBE's of 0.4 V and 1.0 V, βDPN's for the SCDR structure are 2.4×10−6 and 1.6×10−2, respectively and for VBE's of −0.4 V and −1.0 V, bDNP's for the SCDR structure are 5.9×10−7 and 1.1×10−3, respectively. These in turn should radically reduce the latchup susceptibility. These facts also clearly show that Schottky clamps are formed in both NMOS and PMOS transistors.

Figure 22B:
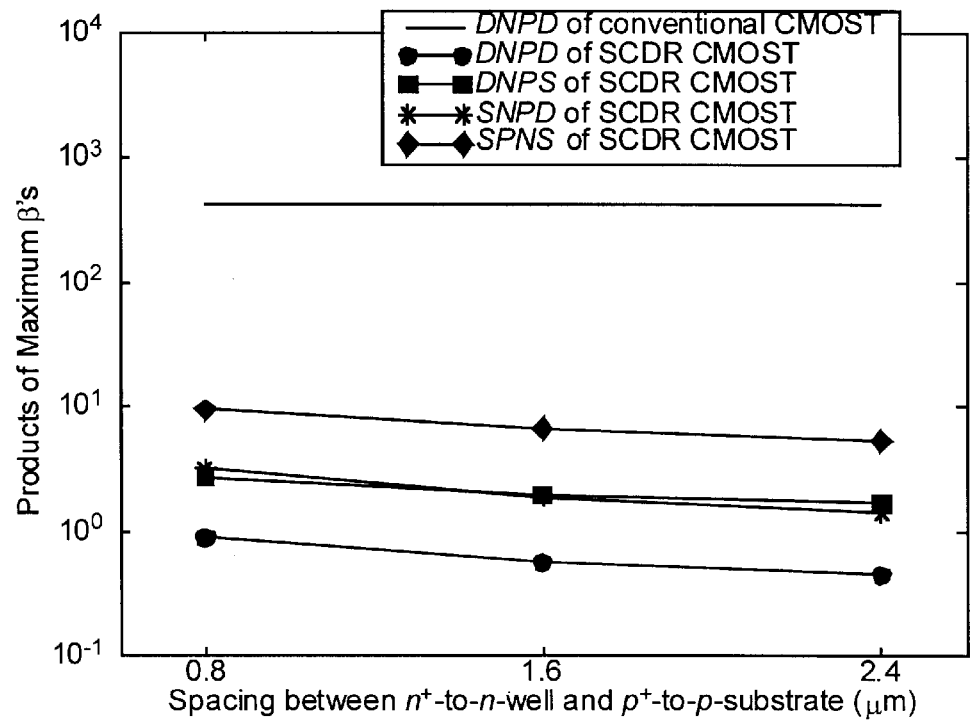
FIG. 22B shows products of maximum current gains (max($\beta$DPN)×max($\beta$DNP)) for conventional and SCDR CMOS structures versus the spacing between n+-drain-to-n-well and p+-drain-to-p-substrate. (D: drain, S: source, N: n-well, P: p-substrate)

FIG. 22B shows the products of maximum current gains (max(βNPN)×max(βPNP)) against n+-drain-to-n-well and p+-drain-to-p-substrate spacings of the SCDR structure for all the possible PNPN thyristor combinations which could trigger latchup. Even for the smallest n+-drain-to-n-well and p+-drain-to-p-substrate spacings of 0.8-um (1.6 um from n+-drain to p+-drain), the product of maximum p+-drain/n-well/p-substrate/n+-drain (DNPD) current gains for SCDR CMOS transistors is lower than the unity. The product of the p+-source/n-well/p-substrate/n+-source (SNPS) thyristor is higher than one but is still much lower than the maximum DNPD product of the conventional CMOS structure. The SNPS is structurally the same as the conventional CMOS parasitic PNPN thyristor. If necessary, the SPNS product can be reduced to lower than one by Schottky clamping the NMOS and PMOS sources. Even with the 1.6-um n+-drain-to-p+-drain spacing, the ultra low current gain products for the SCDR CMOS structure should be able to greatly reduce the susceptibility to latchup. The $BV^{CEO}$'s of the parasitic DPN and DNP bipolar transistors of the SCDR structure with 0.8-um n+-drain-to-n-well and 0.8-um p+-drain-to-p-substrate spacings are 32.4 V and 14.5 V, respectively. These are sufficiently high to provide good transistor isolation between n+-drain-to-n-well and p+-drain-to-p-substrate. These indicate that the reduced latchup susceptibility can also be trade-off to decrease the spacing between n+ and p+ diffusion.

The characteristics of SC and SCDR transistors can be essentially identical to those of conventional MOS transistors. However, SCDR junctions exhibit higher reverse leakage currents than conventional n+-p and p+-n drain junctions due to the edge effect and reduced barrier heights of $Ti_{Si2}$—Si Schottky junctions. SCDR MOS transistors with varying guard band structures have been implemented to study the impact of guard bands on reverse leakage currents of Schottky barrier junctions. The structures were characterized at the room temperature.

Figure 23:
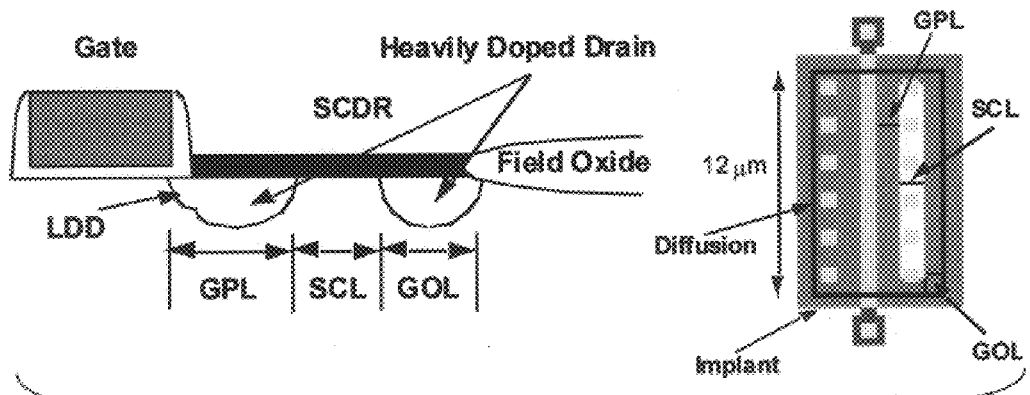
FIG. 23 shows a cross section and a layout of a Schottky clamped drain junction structure with guard bands.
Figure 24:
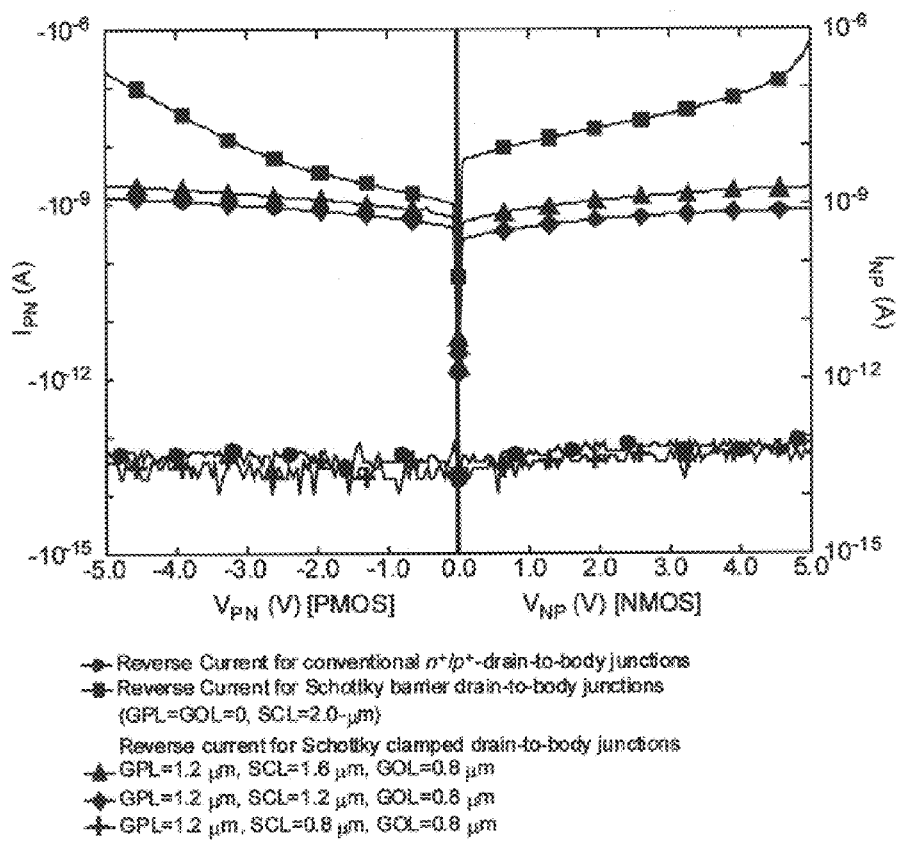
FIG. 24 shows reverse characteristics of drain-to-body, Schottky drain-to-body, and Schottky clamped drain-to-body junctions with varying Schottky clamp lengths for NMOS and PMOS transistors.

FIG. 23 shows a cross section and layout of a Schottky clamped junction with guard bands. The guard band length along the polysilicon edge (GPL), the Schottky clamp length (SCL) and the guard band length along the field oxide edge (GOL) are varied. The remaining two edges at the top and bottom of the SCDR utilized the same length as GOL and the drawn width of the SCDR junction was kept at 12.0 um. FIGS. 24 and 25 show the typical measured data for reverse leakage currents of both drain-to-p-substrate (NMOS) and drain-to-n-well (PMOS) junctions with varying SCDR structures versus reverse junction bias voltage. At a 5-V reverse bias, the reverse leakage of a Schottky barrier drain (SBDR)-to-body junction (the structure without a guard ring) is about 4×106~8×106 times higher than that of conventional p-n junctions. The lengths of these junctions are at the minimum for implementing the respective MOSFET structures which are 2.0 um for both the SBDR and conventional junctions.

FIG. 24 shows that when SCL is changed from 1.6 um to 1.2 um (with GPL=1.2 um and GOL=0.8 um), the reverse leakage current is reduced. When SCL is further reduced to 0.8 um, the leakage current characteristics become the same as those of conventional p-n junctions. This is due to the lateral diffusion of the guard band during subsequent thermal steps, and the misalignment between the LDD and heavy source/drain implant patterns, which can shrink the gap between the guard bands (GPL and GOL) and consequently eliminate the Schottky barrier effects. The guard band reduces the leakage. However, the leakage is still almost four orders of magnitude higher than those of conventional junctions.

Figure 25A:
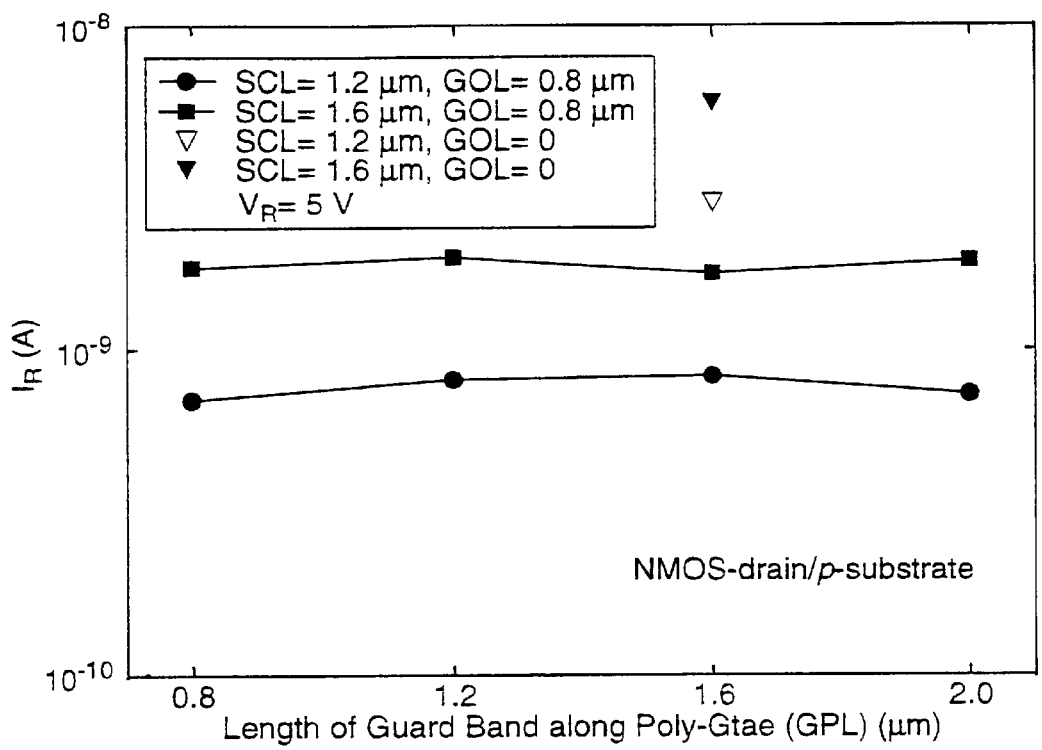
FIG. 25A shows reverse characteristics of Schottky clamped drain-to-body junctions with varying Schottky clamp and guard band lengths at reverse bias of 5 V for NMOS transistors.
Figure 25B:
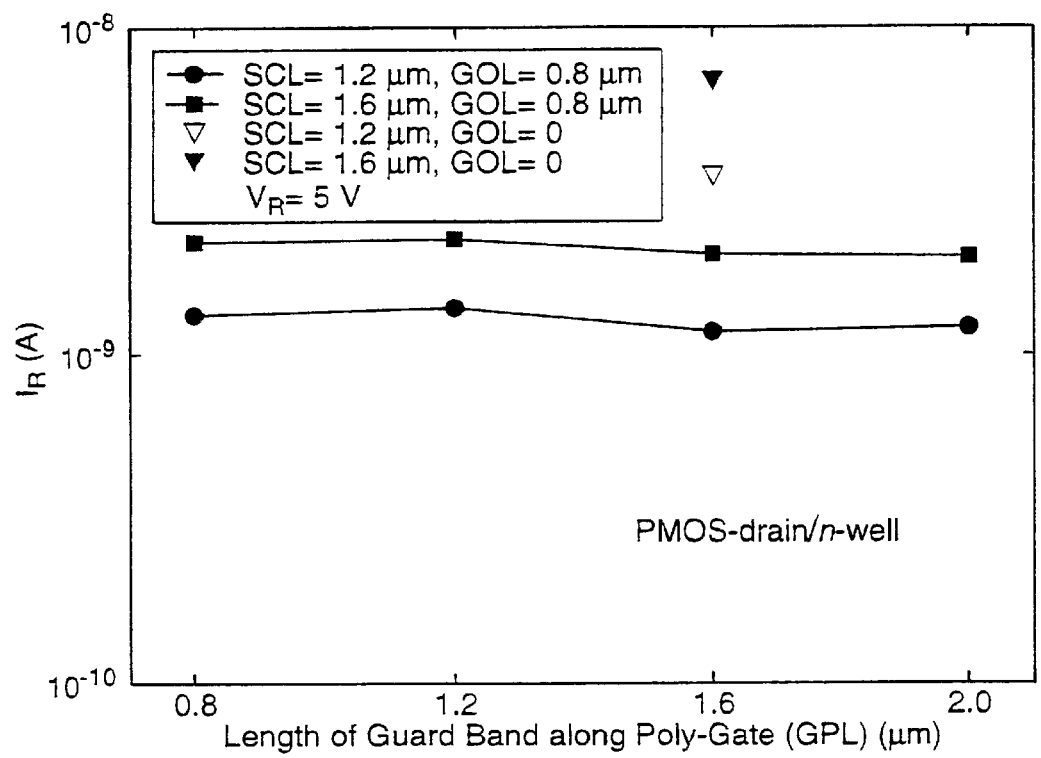
FIG. 25B shows reverse characteristics of Schottky clamped drain-to-body junctions with varying Schottky clamp and guard band lengths at reverse bias of 5 V for PMOS transistors.

The measurements in FIGS. 25A and 25B show that reducing the guard band length along the polysilicon edge (GPL) from 2.0-um to 0.8-um does not notably increase the leakage currents. This suggests that GPL of the SCDR MOS transistors can be decreased to 0.8-um without increasing the leakage current. On the other hand, when the guard band length along the field oxide edge (GOL) is changed from 0.8 to 0-um, the leakage current is increased by about three times at 5-V reverse bias, which implies that the guard bands on all the edges of SCDR's are preferable for improving the reverse characteristics. The minimum length of SCL to maintain low parasitic bipolar current gains is 1.2 um.

The reverse junction breakdown voltage of the SCDR-to-p-substrate junctions is about 13 V which is much higher than the 6-V reverse breakdown voltage of a Schottky barrier drain without the guard ring and is the same as the reverse breakdown voltage of conventional n+-drain-to-p-substrate junctions. For SCDR-to-n-well junctions, the reverse junction breakdown voltage is about 18 V which is once again, the same as those of conventional p+-drain-to-n-well junctions and is slightly higher than the 16-V reverse breakdown voltage of Schottky barrier drain-to-n-well junctions. Due to the larger junction layout area of the SCDR junctions than conventional drain junctions, the junction capacitance of the SCDR with GPL=0.8 um, SCL=1.2 um, and GOL=0.8 um are approximately 10% higher than that of a conventional junction for SCDR-NMOS transistors and 27% higher for SCDR-pMOS transistors.

Figure 26A:
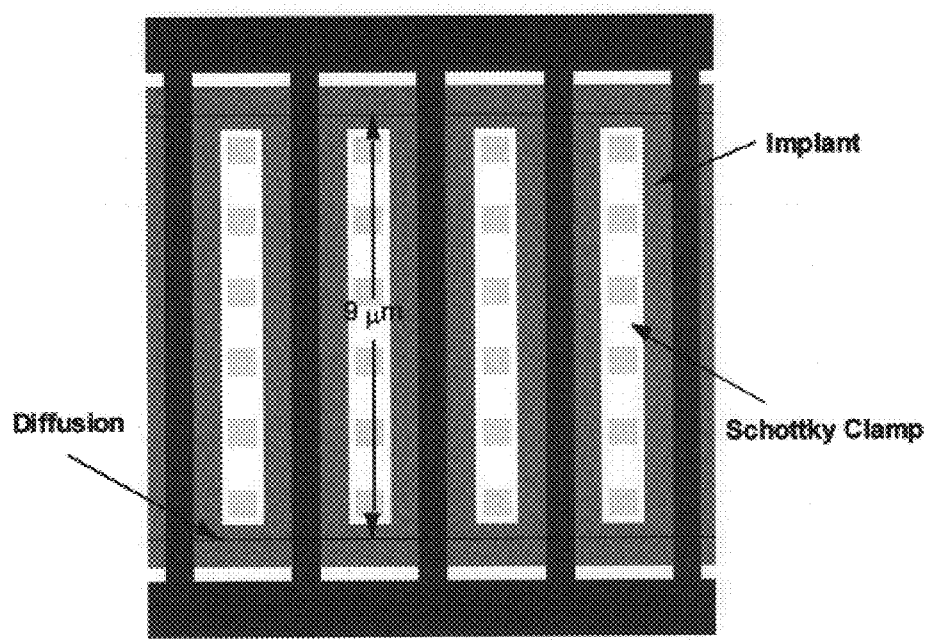
FIG. 26A shows a partial layout of a Schottky clamped test transistor.
Figure 26B:
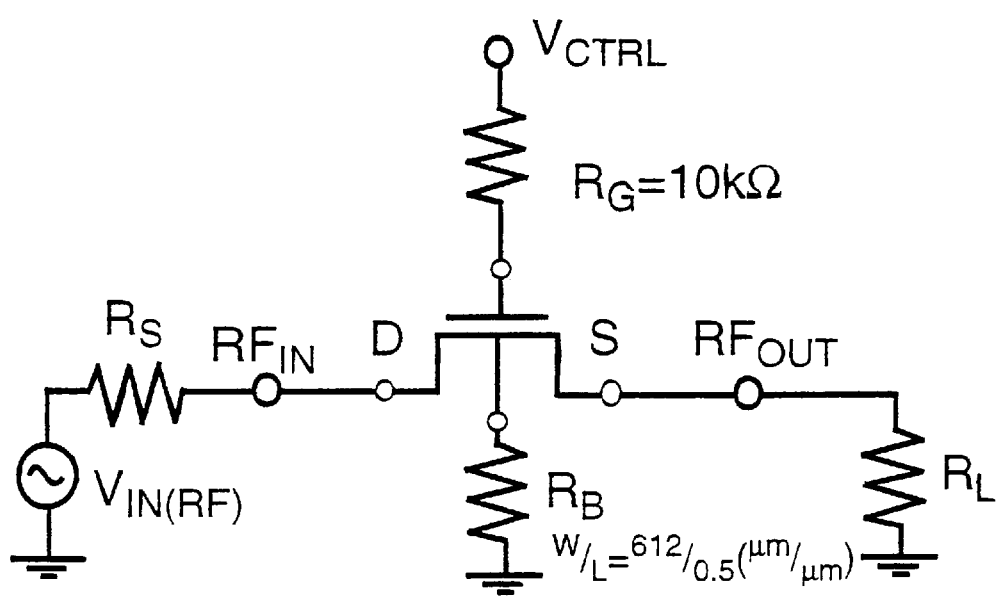
FIG. 26B shows a circuit schematic of a Schottky clamped test switch.

The use of SC MOS transistors for RF switches can greatly reduce the susceptibility to latchup triggered by the forward biasing of the source/drain-to-body junction diodes during large voltage excursions at the input of an RF switch. However, the junction capacitances of Schottky clamped junctions can be slightly higher than those of conventional source/drain-to-body junctions due to a larger layout area (~17%). The increased junction capacitance reduces the impedance from source/drain to substrate which in turn increases RF signal coupling to substrate and can increase the insertion loss of RF switches. To study this quantitatively, Schottky clamped MOS transistors for RF switch applications have been implemented in a foundry 0.5-$\mu$m CMOS process. FIGS. 26A and 26B show a partial layout and a circuit schematic of the Schottky clamped test switch. The transistor width is 612 um. The test transistor is composed of sixty-eight 9-um gate fingers. For RF switch applications, both the source and drain of the transistor are Schottky clamped. The guard band length along the polysilicon gates of the Schottky clamped junction is 0.6 um, and the guard band lengths is 0.3 $_{\mu m}$ on the top and bottom edges, and the SCL is 0.9 um. The 10-k$\Omega$ gate resistance in FIG. 26B is included to AC isolate the gate node and is commonly used in RF switches.

Figure 27:
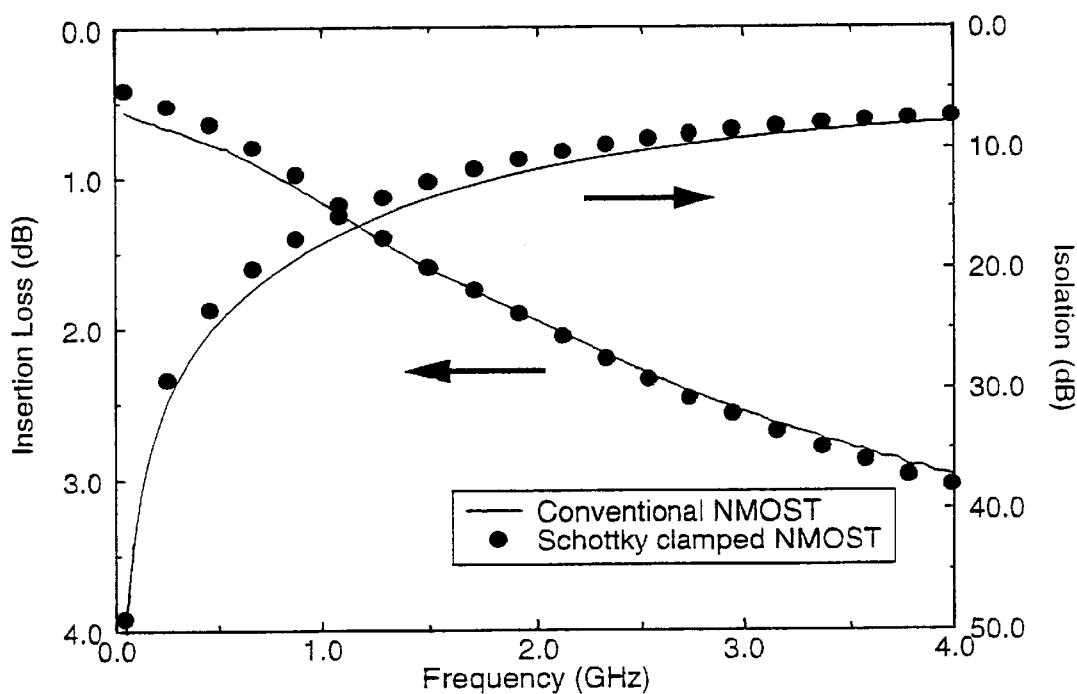
FIG. 27 shows measured insertion loss and isolation for conventional and Schottky clamped NMOS transistors.

FIG. 27 shows the measured insertion loss and isolation of conventional and SC NMOS switches. The structure was measured on-chip using microwave probes. Insertion loss was measured when the DC gate control voltage (VCTRL) was 5 V and source/drain voltages of the transistor were 0 V. Insertion loss of both conventional and SC NMOS switches is almost the same for frequencies up to 4 GHz. Insertion loss is about 1 dB at the intended operating frequency of 1 GHz. The increased junction capacitance of the Schottky clamped junctions has negligible impact on the insertion loss of the NMOS transistor in the measurement frequency range. Isolation was also measured when the transistor was turned off (VGS=VGD=0 V). Isolation of SC MOS switches is slightly lower than that of the conventional NMOS switch for frequencies up to 4 GHz. At 1 GHz, isolation of the SC NMOS switch is about 1.7 dB lower than the 18.5-dB isolation of the conventional NMOS switch. The lower isolation of SC NMOS switches is attributed to the increased source/drain-to-body capacitance which increased the signal coupling from input (drain node of the transistor) to output (source node of the transistor) through substrate when the transistor is turned off.

Figure 28:
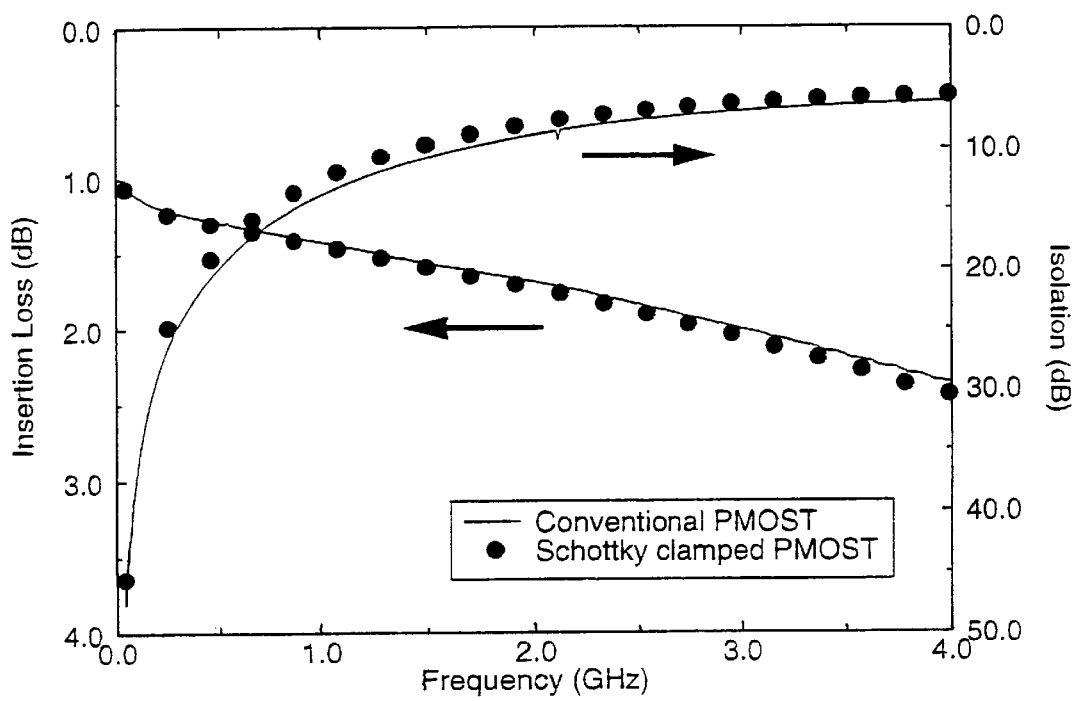
FIG. 28 shows measured insertion loss and isolation for conventional and Schottky clamped PMOS transistors.

FIG. 28 shows the measured insertion loss and isolation of conventional and SC PMOS switches. The test structure was similar to the NMOS switch test structure. Insertion loss was measured when the VCTRL was −5 V to turn on the transistor, and source and drain voltages were 0 V. Insertion loss of both the conventional and SC PMOS switches are similar for frequencies up to 4 GHz. Insertion loss is about 1.4 dB at 1 GHz. Again, the increased junction capacitance of the Schottky clamped junction has almost no impact on the insertion loss. Isolation was measured when the transistor was turned off (VGS=VGD=0 V). Isolation of the SC PMOS switch is slightly lower than that of the conventional PMOS switch. At 1 GHz, isolation of the SC PMOS switch is about 1.3 dB lower than the 14.3-dB isolation of the conventional PMOS switch. These differences in isolation are not critical, since more than adequate isolation for 1 GHz operation can be attained using the switch transistor in conjunction with a shunt transistor. Insertion loss of an NMOS transistor is ~0.4 dB lower than that for a PMOS transistor at 1 GHz. However, for frequencies greater than ~1.5 GHz, the PMOS insertion loss is lower. This is attributed to sufficiently large body (n-well) resistance of the PMOS transistor.

These results indicate that RF transmit/receive switches implemented with SC MOS transistors should have the same performance as those using conventional MOS transistors while having greatly reduced susceptibility to latchup than conventional MOS transistors.

To study the applicability of SC structures to deep submicron CMOS processes, SCDR NMOS and PMOS transistors have been implemented in a 0.25-$\mu$m CMOS process. Output I-V characteristics of 0.25-$\mu$m SCDR NMOS and PMOS transistors are identical to those of conventional MOS transistors, while the current gains of parasitic n+-drain/p-substrate/n-well and p+-drain/n-well/p-substrate bipolar transistors involved in latchup are also significantly reduced.

Figure 29:
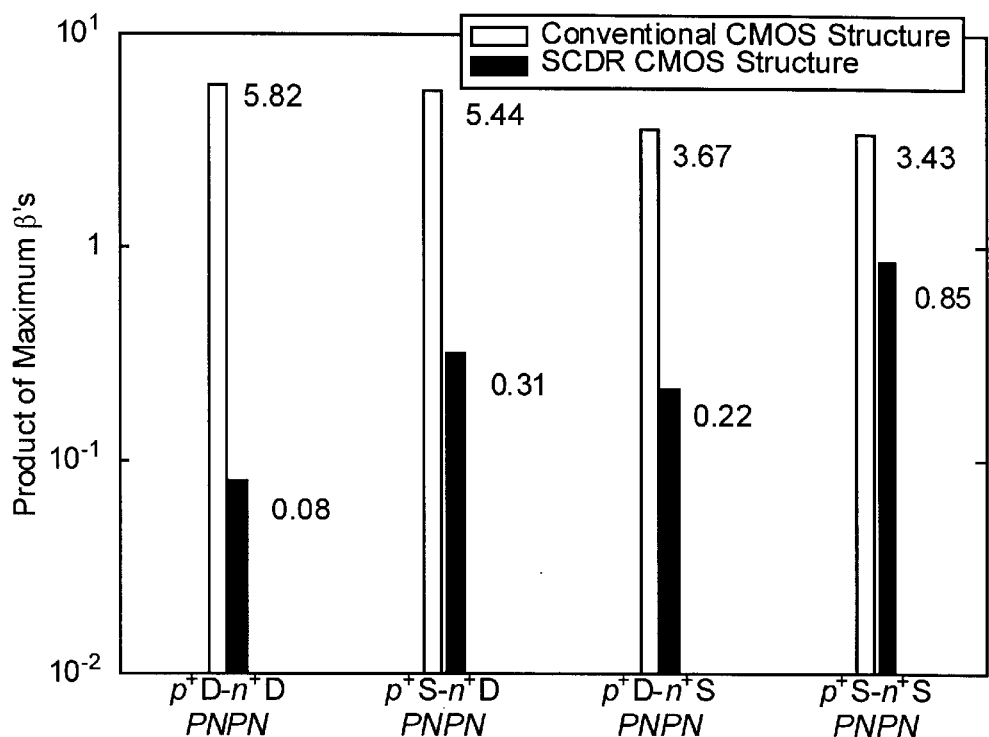
FIG. 29 shows products of maximum current gains (max ($\beta$DPN)×max($\beta$DNP)) for conventional and SCDR CMOS structures for all the possible PNPN thyristor combinations which could trigger latchup. (D: drain, S: source).

FIG. 29 shows the products of maximum current gains for all the PNPN thyristor combinations in a CMOS inverter which could trigger latchup. The bipolar structures were constructed using 0.9-um n+-drain-to-n-well and 0.9-um p+-drain-to-p-substrate spacings with GPL=0.3 um, SCL= 0.45 $_{\mu m}$ and GOL=0.3 $_{\mu m}$ (FIG. 23). The drains serve as the emitters of the bipolar transistors. Once again, the parasitic DPN and DNP bipolar actions can be greatly reduced. As a matter of fact, the products of maximum current gains for all possible PNPN combinations in the SCDR CMOS structure are all less than 1. These, in turn, should eliminate latchup in the 0.25-um CMOS process.

Figure 30:
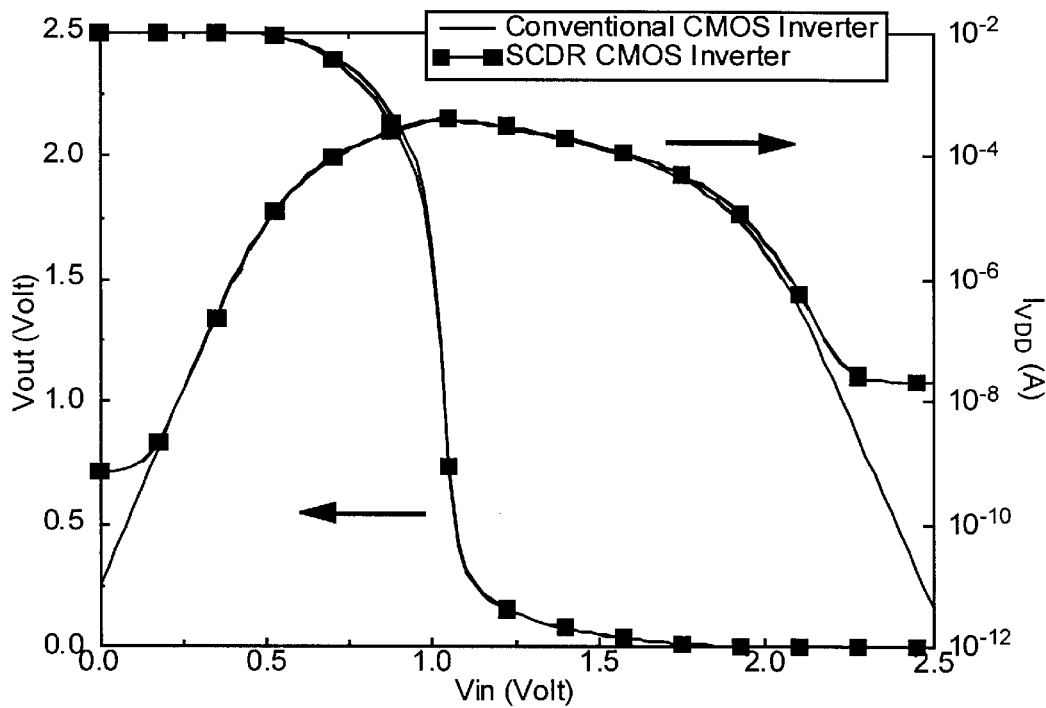
FIG. 30 shows voltage transfer curves and supply currents for 0.25-$\mu$m SCDR and conventional CMOS inverters. (WPMOS=WNMOS=4.5 $\mu$m)

FIG. 30 compares the transfer characteristics and supply currents for both conventional and SCDR CMOS inverters with NMOS Width=PMOS Width=4.5 um. For SCDR CMOS inverters, the transfer characteristics are almost identical to the conventional CMOS inverter. The off currents of the SCDR inverter are higher than those of the conventional CMOS inverter due to the higher junction leakage currents of SCDR junctions. The leakage current density is ~4 nA/um, which is close to the typical 1 nA/um leakage specification for CMOS processes. The ratio of on- and off-current is about 104 for the SCDR CMOS inverter. These results clearly indicate that SC MOS transistors and circuits using the transistors can be implemented in deep submicron CMOS processes, and the transistors possess good electrical characteristics.

It should be understood that the examples and embodiments described herein are for illustrative purposes only and that various modifications or changes in light thereof will be suggested to persons skilled in the art and are to be included within the spirit and purview of this application.

What is claimed is:

1. A device, comprising:
an insulated gate field effect transistor having a gate, a drain, a source, a body, and a Schottky diode in parallel with the drain, and an additional insulated gate field effect transistor of opposite carrier polarity having an additional gate, an additional drain, an additional source, an additional body, and an additional Schottky diode in parallel with the additional drain, wherein the drain and the additional drain are merged such that the Schottky diode and the additional Schottky diode are adjacent and positioned between the drain and the additional drain.

2. The device according to claim 1, wherein a first guard band is positioned between the Schottky diode and the gate such that the first guard band runs along the gate and functions as the drain, and wherein a second guard band is positioned between the additional Schottky diode and the additional gate such that the second guard band runs along the additional gate and functions as the additional drain.

3. The device according to claim 1,
wherein a continuous layer of a conductor contacts the drain, is part of the Schottky diode, is part of the additional Schottky diode, and contacts the additional drain.

4. The device according to claim 3, wherein the conductor is a metal silicide.

5. The device according to claim 3, wherein the conductor is a metal.

6. The device according to claim 3,
wherein a single metal contact contacts the conductor in order to electrically contact the drain, the additional drain, the Schottky diode, and the additional Schottky diode.

7. The device according to claim 1, further comprising:
a third Schottky diode in parallel with the source.

8. The device according to claim 7,
wherein a first section of a third guard band is positioned between the third Schottky diode and the gate such that the first section of the third guard band runs along the gate and functions as the source, and wherein a second section of the third guard band is positioned between the third Schottky diode and an isolation region.

9. The device according to claim 8, further comprising:
a fourth Schottky diode in parallel with the additional source.

10. The device according to claim 9,
wherein a first section of a fourth guard band is positioned between the fourth Schottky diode and the additional gate such that the first section of the fourth guard band runs along the additional gate and functions as the additional source, and wherein a second section of the fourth guard band is positioned between the fourth Schottky diode and an additional isolation region.

11. A device comprising:
an insulated gate field effect transistor having a gate, a drain, a source, a body, and a Schottky diode in parallel with the drain,
wherein a first section of a guard band is positioned between the Schottky diode and the gate such that the first section of the guard band runs along the gate and functions as the drain,
wherein a second section of the guard band is positioned between the Schottky diode and an isolation region, further comprising:
an additional transistor of opposite carrier polarity comprising an additional gate, an additional drain, an additional source, an additional body, and an additional Schottky diode in parallel with the additional drain,
wherein the drain and the additional drain are separated by the isolation region,
wherein a first section of an additional guard band is positioned between the additional Schottky diode and the isolation region and a second section of the additional guard band is positioned between the Schottky diode and the additional gate such that the second section of the additional guard band runs along the additional gate and functions as the additional drain
wherein a first continuous conductor contacts the first section of the guard band, is part of the Schottky diode, and contacts the second section of the guard band,
wherein a second continuous conductor contacts the first section of the additional guard band, is part of the additional Schottky diode, and contacts the second section of the additional guard band, and,
a third Schottky diode in parallel with the source, wherein the third Schottky diode is positioned between a first section of a third guard band and a second section of the third guard band, and the first section of the third guard band is positioned between the gate and the third Schottky diode such that the first section of the third guard band runs along the gate and functions as the source, and wherein the second section of the third guard band is positioned between the third Schottky diode and a second isolation region.

12. The device according to claim 11, further comprising:
a fourth Schottky diode in parallel with the additional source, wherein the fourth Schottky diode is positioned between a first section of a fourth guard band and a second section of the fourth guard band, and the first section of the fourth guard band is positioned between the additional gate and the fourth Schottky diode such that the first section of the fourth guard band runs along the additional gate and functions as the additional source, and wherein the second section of the fourth guard band is positioned between the fourth Schottky diode and a third isolation region.

13. The device according to claim 12, wherein a third continuous conductor contacts the first section of the third guard band, is part of the third Schottky diode, and contacts the second section of the third guard band.

14. The device according to claim 13, wherein a fourth continuous conductor contacts the first section of the fourth guard band, is part of the fourth Schottky diode, and contacts the second section of the fourth guard band.

15. A device comprising:
an insulated gate field effect transistor having a gate, a drain, a source, a body, and a Schottky diode in parallel with the source,
wherein a first section of a first guard band is positioned between the Schottky diode and the gate such that the first section of the first guard band runs along the gate and functions as the source,
wherein a continuous conductive layer contacts the first section of the guard band and is part of the Schottky diode,
wherein an insulation layer is formed adjacent a first portion of the continuous conductive layer such that a drain electrode electrically contacts a second portion of the continuous conductive layer to which the insulation layer is not adjacent and the drain electrode is insulated from the first portion of the continuous conductive layer; and
an additional insulated gate field effect transistor of opposite carrier polarity having an additional gate, an additional drain, an additional source, an additional body, and an additional Schottky diode in parallel with the additional source,
wherein a first section of a second guard band is positioned between the additional Schottky diode and the additional gate such that the first section of the second guard band runs along the additional gate and functions as the additional source,
wherein a second continuous conductive layer contacts the first section of the second guard band and is part of the additional Schottky diode,
wherein a second insulation layer is formed adjacent a first portion of the second continuous conductive layer such that an additional drain electrode electrically contacts a second portion of the second continuous conductive layer to which the second insulation layer is not adjacent and the additional drain electrode is insulated from the first portion of the second continuous conductive layer,
wherein the drain and the additional drain are separated by an isolation region,
wherein a second section of the first guard band is positioned between the Schottky diode and a second isolation region.

16. The device according to claim 15,
wherein a second section of the second guard band is positioned between the a additional Schottky diode and a third isolation region.

17. A device, comprising:
an insulated gate field effect transistor having a gate, a drain, a source, a body, and a Schottky diode in parallel with the source,
wherein a first section of a first guard band is positioned between the Schottky diode and the gate such that the first section of the first guard band runs along the gate and functions as the source, further comprising:
an additional insulated gate field effect transistor of opposite carrier polarity having an additional gate, an additional drain, an additional source, an additional body, and an additional Schottky diode in parallel with the additional source,
wherein a first section of a second guard band is positioned between the additional Schottky diode and the additional gate such that the first section of the second guard band runs along the additional gate and functions as the additional source
wherein the drain and the additional drain are separated by an isolation region and,
wherein a third guard band is positioned between the Schottky diode and a second isolation region, such that the third guard band runs along the second isolation region and functions as a connection to the body, wherein the third guard band is of opposite doping polarity with respect to the first section of the first guard ring.

18. The device according to claim 17,
wherein a single conductor contacts the source, is part of the Schottky diode, and contacts the connector to the body.

19. The device according to claim 18,
wherein a fourth guard band is positioned between the additional Schottky diode and a third isolation region, such that the fourth guard band runs along the third isolation region and functions as a connection to the additional body, wherein the fourth guard band is of opposite doping polarity with respect to the first section of the second guard ring.

20. The device according to claim 19,
wherein a second single conductor contacts the additional source, is part of the additional Schottky diode, and contacts the connector to the additional body.

* * * * *